(12) United States Patent
Abbott et al.

(10) Patent No.: US 8,513,104 B2
(45) Date of Patent: Aug. 20, 2013

(54) METHODS OF FORMING A FLOATING JUNCTION ON A SOLAR CELL WITH A PARTICLE MASKING LAYER

(75) Inventors: Malcolm Abbott, San Jose, CA (US); Maxim Kelman, Mountain View, CA (US); Eric Rosenfeld, Sunnyvale, CA (US); Elena Rogojina, Los Altos, CA (US); Giuseppe Scardera, Sunnyvale, CA (US)

(73) Assignee: Innovalight, Inc., Sunnyvale, CA (US)

( * ) Notice: Subject to any disclaimer, the term of this patent is extended or adjusted under 35 U.S.C. 154(b) by 0 days.

(21) Appl. No.: 13/172,040

(22) Filed: Jun. 29, 2011
(Under 37 CFR 1.47)

(65) Prior Publication Data
US 2012/0083104 A1    Apr. 5, 2012

Related U.S. Application Data

(63) Continuation-in-part of application No. 12/656,710, filed on Feb. 12, 2010, now Pat. No. 8,420,517.

(60) Provisional application No. 61/360,413, filed on Jun. 30, 2010, provisional application No. 61/222,628, filed on Jul. 2, 2009.

(51) Int. Cl.
*H01L 21/22* (2006.01)
*H01L 21/38* (2006.01)

(52) U.S. Cl.
USPC ........... 438/549; 438/558; 438/563; 438/565; 438/57; 257/E27.124; 257/E27.125; 257/E27.126; 257/E25.007; 136/243; 136/244; 136/252

(58) Field of Classification Search
USPC ... 438/549, 558, 563, 565, 57; 257/E27.124, 257/E27.125, E27.126, E25.007; 136/244, 136/252, 243
See application file for complete search history.

(56) References Cited

U.S. PATENT DOCUMENTS

| 4,068,018 A | 1/1978 | Hashimoto et al. |
| 4,445,267 A | 5/1984 | De La Moneda et al. |

(Continued)

OTHER PUBLICATIONS

U.S. Appl. No. 12/506,811, filed Jul. 21, 2009, Scardera et al.

(Continued)

*Primary Examiner* — Kimberly Rizkallah
*Assistant Examiner* — Maria Ligai
(74) *Attorney, Agent, or Firm* — Foley & Lardner LLP

(57) ABSTRACT

A method of forming a floating junction on a substrate is disclosed. The method includes providing the substrate doped with boron atoms, the substrate comprising a front surface and a rear surface. The method also includes depositing a set of masking particles on the rear surface in a set of patterns; and heating the substrate in a baking ambient to a first temperature and for a first time period in order to create a particle masking layer. The method further includes exposing the substrate to a phosphorous deposition ambient at a second temperature and for a second time period, wherein a front surface PSG layer, a front surface phosphorous diffusion, a rear surface PSG layer, and a rear surface phosphorous diffusion are formed, and wherein a first phosphorous dopant surface concentration in the substrate proximate to the set of patterns is less than a second dopant surface concentration in the substrate not proximate to the set of patterns. The method also includes exposing the substrate to a set of etchants for a third time period, wherein the front surface PSG layer and the rear surface PSG layer are substantially removed; depositing a front surface $SiN_x$ layer and a rear surface $SiN_x$ layer; and forming a rear metal contact on the rear surface through the rear surface $SiN_x$ layer proximate to the set of patterns.

11 Claims, 18 Drawing Sheets

(56) References Cited

U.S. PATENT DOCUMENTS

| | | | |
|---|---|---|---|
| 5,627,081 A | 5/1997 | Tsuo et al. | |
| 5,656,556 A | 8/1997 | Yang | |
| 6,130,380 A | 10/2000 | Nakamura | |
| 6,171,975 B1 | 1/2001 | Hase et al. | |
| 6,461,901 B1 | 10/2002 | Noguchi | |
| 7,135,350 B1 | 11/2006 | Smith et al. | |
| 7,192,873 B1 | 3/2007 | Kim et al. | |
| 7,355,238 B2 | 4/2008 | Takata et al. | |
| 7,411,255 B2 | 8/2008 | Parekh et al. | |
| 7,615,393 B1 | 11/2009 | Shah et al. | |
| 8,236,598 B2 | 8/2012 | Khadilkar et al. | |
| 2003/0134469 A1* | 7/2003 | Horzel et al. | 438/249 |
| 2005/0176164 A1* | 8/2005 | Gee et al. | 438/48 |
| 2006/0096635 A1 | 5/2006 | Tuttle | |
| 2006/0211187 A1 | 9/2006 | Choi et al. | |
| 2007/0158621 A1* | 7/2007 | Sakamoto et al. | 252/500 |
| 2007/0246689 A1 | 10/2007 | Ge et al. | |
| 2008/0044964 A1 | 2/2008 | Kamath et al. | |
| 2008/0111206 A1 | 5/2008 | Hanoka et al. | |
| 2008/0138966 A1 | 6/2008 | Rogojina et al. | |
| 2008/0146005 A1 | 6/2008 | Lemmi et al. | |
| 2008/0160265 A1 | 7/2008 | Hieslmair et al. | |
| 2008/0182390 A1 | 7/2008 | Lemmi et al. | |
| 2008/0283120 A1 | 11/2008 | Komatsu et al. | |
| 2008/0302660 A1 | 12/2008 | Kahn et al. | |
| 2009/0017606 A1 | 1/2009 | Fath et al. | |
| 2009/0020156 A1* | 1/2009 | Ohtsuka et al. | 136/256 |
| 2009/0020158 A1 | 1/2009 | Ohtsuka et al. | |
| 2009/0239330 A1 | 9/2009 | Vanheusden et al. | |
| 2009/0239363 A1 | 9/2009 | Leung et al. | |
| 2009/0269913 A1 | 10/2009 | Terry et al. | |
| 2010/0015749 A1 | 1/2010 | Borden | |
| 2010/0015750 A1* | 1/2010 | Shen et al. | 438/72 |
| 2010/0035422 A1 | 2/2010 | Leung et al. | |
| 2010/0294349 A1 | 11/2010 | Srinivasan et al. | |
| 2011/0203659 A1 | 8/2011 | Carroll et al. | |
| 2012/0100666 A1 | 4/2012 | Gee et al. | |

OTHER PUBLICATIONS

U.S. Appl. No. 12/656,710, filed Feb. 12, 2010, Scardera et al.
U.S. Appl. No. 12/626,198, filed Nov. 25, 2009, Kelman et al.
U.S. Appl. No. 12/692,878, filed Jan. 25, 2010, Scardera et al.
U.S. Appl. No. 12/794,188, filed Jun. 4, 2010, Scardera et al.
U.S. Appl. No. 13/099,794, filed May 3, 2011, Kelman et al.
U.S. Appl. No. 13/238,252, filed May 3, 2011, Scardera et al.

Altermatt et al., "Rear surface passivation of high-efficiency silicon solar cells by a floating junction," J. Appl. Phys., Sep. 15, 1996, 80(6):3574-3586.
Bentzen et al., "Understanding phosphorus emitter diffusion in silicon solar cell processing," Proceedings of the 21$^{st}$ European Photovoltaic Solar Energy Conference, Dresden, Germany, 2006, 1388-1391.
Blakers et al., "22.8% efficient silicon solar cell," Appl. Phys. Lett., Sep. 25, 1989, 55(13):1363-1365.
Bultman et al., Ideal Single Diffusion Step Selective Emitters: A Comparison Between Theory and Practice, *European Photovoltaic Solar Energy Conference and Exhibition*, Munich (2001).
Dauwe et al., "Experimental Evidence of Parasitic Shunting in Silicon Nitride Rear Surface Passivated Solar Cells," Progress in Photovoltaics: Research and Applications, 2002, 10:271-278.
Drabczyk et al., The influence of porous silicon on junction formation in silicon solar cells, *Solar Energy Materials & Solar Cells*, 76:545-551 (2003).
González-Díaz et al., Low-porosity porous silicon nanostructures on monocrystalline silicon solar cells, *Physica E*, 38:215-218 (2007).
Honsberg et al., "685 mV Open-circuit voltage laser grooved silicon solar cell," Solar Energy Materials and Solar Cells, 1994, 34:117-123.
Hubbard et al., "Thermodynamic stability of binary oxides in contact with silicon," J. Mater. Res., Nov. 1996, 11(11):2757-2776.
International Search Report and Written Opinion mailed Sep. 16, 2011, in PCT/US2011/038359, 14 pages.
International Search Report and Written Opinion dated Jan. 27, 2011, in PCT/US2010/057782, 14 pages.
International Search Report and Written Opinion dated Mar. 18, 2011, in PCT/US2011/022107, 8 pages.
International Search Report and Written Opinion dated Oct. 21, 2011, in PCT/US2011/042330, 9 pages.
International Search Report and Written Opinion mailed May 27, 2011, in PCT/US2011/22377, 13 pages.
International Search Report and Written Opinion mailed Sep. 2, 2010, in PCT/US2010/040623, 10 pages.
Jones, Scotten W., Diffusion in Silicon, IC Knowledge LLC (2000).
Moon et al., Selective emitter using porous silicon for crystalline silicon solar cells, *Solar Energy Materials & Solar Cells*, (2008).
Trupke et al., "Photoluminescence imaging of silicon wafers," Applied Physics Letters, 2006, 89:044107-1 to 044107-3.
Voyer et al., "Progress in the Use of Sprayed Phosphoric Acid as an Inexpensive Dopant Source for Industrial Solar Cells," 20$^{th}$ European Photovoltaic Solar Energy Conference, Jun. 2005, 4 pages.
Wang et al., "24% efficient silicon solar cells," Appl. Phys. Lett., Aug. 6, 1990, 57(6):602-604.

\* cited by examiner

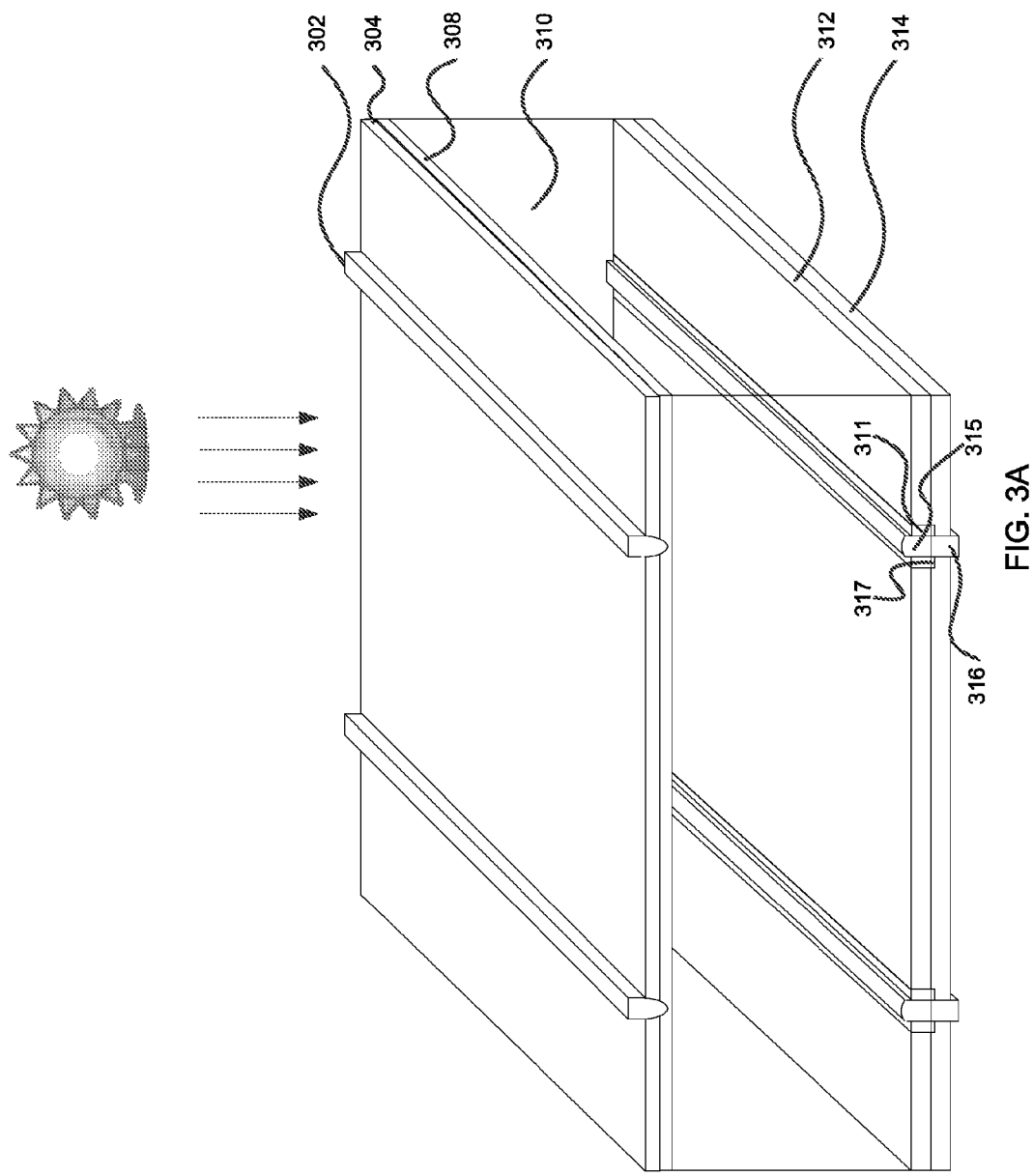

METHODS OF FORMING A FLOATING JUNCTION ON A SOLAR CELL WITH A PARTICLE MASKING LAYER

CROSS-REFERENCE TO RELATED APPLICATIONS

This application claims the benefit of U.S. Provisional App. No. 61/360,413, filed Jun. 30, 2010. This application is a Continuation-In-Part of U.S. patent application Ser. No. 12/656,710, filed Feb. 12, 2010, entitled Methods of Forming a Multi-Doped Junction with Silicon-Containing Particles, which claims the benefit of U.S. Provisional App. No. 61/222, 628 filed Jul. 2, 2009, entitled Methods of Using A Silicon Particle Fluid To Control In Situ A Set Of Dopant Diffusion Profiles. The entire disclosures of the above applications are incorporated by reference.

FIELD OF DISCLOSURE

This disclosure relates in general to p-n junctions and in particular to methods of forming a floating junction on a solar cell with a particle masking layer.

BACKGROUND

A solar cell converts solar energy directly to DC electric energy. Generally configured as a photodiode, it permits light to penetrate into the vicinity of metal contacts such that a generated charge carrier (electrons or holes (a lack of electrons)) may be extracted as current. And like most other diodes, photodiodes are formed by combining p-type and n-type semiconductors to form a junction.

Electrons on the p-type side of the junction within the electric field (or built-in potential) may then be attracted to the n-type region (usually doped with phosphorous) and repelled from the p-type region (usually doped with boron), whereas holes within the electric field on the n-type side of the junction may then be attracted to the p-type region and repelled from the n-type region. Generally, the n-type region and/or the p-type region can each respectively be comprised of varying levels of relative dopant concentration, often shown as n−, n+, n++, p−, p+, p++, etc. The built-in potential and thus magnitude of electric field generally depend on the level of doping between two adjacent layers.

Substantially affecting solar cell performance, carrier lifetime (recombination lifetime) is defined as the average time it takes an excess minority carrier (non-dominant current carrier in a semiconductor region) to recombine and thus become unavailable to conduct an electrical current. Likewise, diffusion length is the average distance that a charge carrier travels before it recombines. In general, although increasing dopant concentration improves conductivity, it also tends to increase recombination. Consequently, the shorter the recombination lifetime or recombination length, the closer the metal region must be to where the charge carrier was generated.

Most solar cells are generally formed on a silicon substrate doped with a first dopant (commonly boron) forming an absorber region, upon which a second counter dopant (commonly phosphorous), is diffused forming the emitter region, in order to complete the p-n junction. After the addition of passivation, back surface field (BSF), and anti-reflection coatings, metal contacts (fingers and busbar on the emitter and pads on the back of the absorber) may be added in order to extract generated charge. The BSF, in particular, must be optimized for both carrier collection and for contact with the metal electrodes.

For example, aluminum deposited on the rear of the solar cell and heated at temperatures between 700° C. and 1000° C., forms a BSF that is a combination of P—Si/P+—Si/Si—Al eutectic and agglomerated Al.

Referring now to FIG. 1, a simplified diagram of a traditional front-contact solar cell is shown. In a common configuration, a phosphorous-doped (n-type) emitter region 108 is first formed on a boron-doped silicon substrate 110 (p-type), although a configuration with a boron-doped emitter region on a phosphorus-doped silicon substrate may also be used.

Prior to the deposition of silicon nitride ($SiN_x$) layer 104 on the front of the substrate, residual surface glass (PSG) formed on the substrate surface during the $POCl_3$ deposition process may be removed by exposing the doped silicon substrate to an etchant, such as hydrofluoric acid (HF). The set of metal contacts, comprising front-metal contact 102 and back surface field (BSF)/back metal contact 116, are then sequentially formed on and subsequently fired into doped silicon substrate 110.

The front metal contact 102 is commonly formed by depositing an Ag (silver) paste, comprising Ag powder (about 70 to about 80 wt % (weight percent)), lead borosilicate glass (frit) $PbO$—$B_2O_3$—$SiO_2$ (about 1 to about 10 wt %), and organic components (about 15 to about 30 wt %). After deposition the paste is dried at a low temperature to remove organic solvents and fired at high temperatures to form the conductive metal layer and to enable the silicon-metal contact.

BSF/back metal contact 116 is generally formed from aluminum (in the case of a p-type substrate) and is configured to create a potential barrier that repels and thus minimizes the impact of minority carrier rear surface recombination. In addition, Ag pads [not shown] are generally applied onto BSF/back metal contract 116 in order to facilitate soldering for interconnection into modules.

However, the use of an Al-BSF may also be problematic. Al-BSF tends to cause solar cell warping, which leads to difficulties in subsequent production processes and decreases the yield due to increased breakage. In addition, not only is Al-BSF a suboptimal reflection surface, reducing the red spectrum that would otherwise be reflected back into the wafer substrate, but it is also not generally the best form of rear passivation available.

One solution is to replace the full area Al-BSF with a more reflective better passivated layer and make contact to the bulk through reduced area metal contacts. A solar cell configured in such a way will reduce charge carrier recombination in the bulk and increase absorption of long wavelength light. Solar cells configured with this architecture are commonly referred to as PERC (Passivated Emitter and Rear Cell) an architecture that was first introduced in 1989 by the University of New South Wales [A. W. Blakers, et al., Applied Physics Letters, 55 (1989) 1363-1365]. The devices fabricated in that study used heavily doped substrates as well as numerous expensive processing steps that are not compatible with high throughput manufacturing. Other versions of this cell architecture were later introduced as options to further increase the efficiency. Most notable among them is the PERL (passivated emitter rear locally diffused) [A. Wang, et al. J. Appl. Phys. Lett. 57, 602, (1990)] and PERF (passivated emitter rear floating junction) cells [P. P. Altermatt, et al. J. Appl. Phys. 80 (6), September 1996, pp. 3574-3586]. Similar to the original PERC cell, these architectures are expensive to manufacture. Since their introduction there have been numerous attempts to develop an industrially viable approach to make these cells.

One important feature of these cells is the passivation layer on the rear surface. One approach is to use the residual rear phosphorous diffusion, created during the front-side phosphorous diffusion process (or in a separate diffusion step), provided it is disconnected from the front junction. This type of passivation is referred to as a rear floating junction and has been shown to provide excellent quality rear passivation [C. B. Honsberg, Solar Energy Materials and Solar Cells 34, Issues 1-4, 1 Sep. 1994, Pages 117-123]. Another type of rear floating junction can be formed by removing the rear n-type diffusion and passivating the bulk silicon with a silicon nitride layer. In this case the fixed charge in the nitride causes an inversion layer to form, resulting in an effective floating junction.

Floating junctions provide excellent rear surface passivation, but they do not allow a contact to be formed between the rear metal electrode and the bulk of the wafer. The cell design requires that selective openings be formed in the rear surface passivation layer through which metal is able to contact to the bulk region. When this happens it is very common for the metallization used to form a linear shunt between the floating junction and the substrate. This shunt path greatly reduces the passivation provided by the floating junction, resulting in reduced cell efficiency [S. Dauwe, et al. Prog. Photovolt: Res. Appl. 2002; 10:271-278].

Referring now to FIG. 2, a simplified diagram of a passivated layer/reduced area metal contact solar cell configuration with detrimental shunting. An ohmic contact is necessary for a good silicon metal interface. In general, increasing the doping concentration of the silicon allows formation of an ohmic contact.

Metal contact 216, (comprising Ag paste with a lead borosilicate glass frit or Al BSF paste), is generally fired at high temperatures through rear passivation/reflectivity layer 214 (commonly $SiN_x$) to form the conductive silicon-metal contact with p-type silicon substrate 210. The region under the metal is heavily doped p-type 208 to facilitate good ohmic contact to the silicon bulk 210. This doping may be formed before metal firing or during firing such as the case with Al BSF paste. This region must also separate the metal 216 from the floating junction passivation 212 to avoid the aforementioned shunting problem. If it is unable to separate the metal from the floating junction, for example because of a substantially greater dopant concentration in the floating junction ($5e19\ cm^{-3}$ to $1e21\ cm^{-3}$) compared to the p+ region formed with Al BSF paste ($<1e19\ cm^{-3}$), then a shunt path will form and the rear passivation will not function correctly 218.

In view of the foregoing, there is a desire to form a floating junction on a solar cell with a particle masking layer.

SUMMARY

The invention relates, in one embodiment, to a method of forming a floating junction on a substrate. The method includes providing the substrate doped with boron atoms, the substrate comprising a front surface and a rear surface. The method also includes depositing a set of masking particles on the rear surface in a set of patterns; and heating the substrate in a baking ambient to a first temperature and for a first time period in order to create a particle masking layer. The method further includes exposing the substrate to a phosphorous deposition ambient at a second temperature and for a second time period, wherein a front surface PSG layer, a front surface phosphorous diffusion, a rear surface PSG layer, and a rear surface phosphorous diffusion are formed, and wherein a first phosphorous dopant surface concentration in the substrate proximate to the set of patterns is less than a second dopant surface concentration in the substrate not proximate to the set of patterns. The method also includes exposing the substrate to a set of etchants for a third time period, wherein the front surface PSG layer and the rear surface PSG layer are substantially removed; depositing a front surface $SiN_x$ layer and a rear surface $SiN_x$ layer; and forming a rear metal contact on the rear surface through the rear surface $SiN_x$ layer proximate to the set of patterns, forming a floating junction on a substrate. The method includes providing the substrate doped with boron atoms, the substrate comprising a front surface and a rear surface. The method further includes depositing a set of masking particles on the rear surface in a set of patterns; and heating the substrate in a baking ambient to a first temperature and for a first time period in order to create a particle masking layer. The method also includes exposing the substrate to a phosphorous deposition ambient at a second temperature and for a second time period, wherein the PSG layer is formed on the front surface and the rear surface, and wherein a first phosphorous dopant surface concentration in the substrate below the set of patterns is less than a second dopant surface concentration in the substrate not below the set of patterns. The method further includes exposing the substrate to an etchant for a third time period, wherein the PSG layer is substantially removed; depositing a front surface $SiN_x$ layer and a rear surface $SiN_x$ layer; and forming a rear metal contact on the rear surface through the $SiN_x$ layer proximate to the set of patterns.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 3A-B show a simplified set of diagrams of a front-contact solar cell with a rear floating junction in which a particle masking layer deposited prior to a phosphorous diffusion, in accordance with the invention;

DETAILED DESCRIPTION

Figure 1:
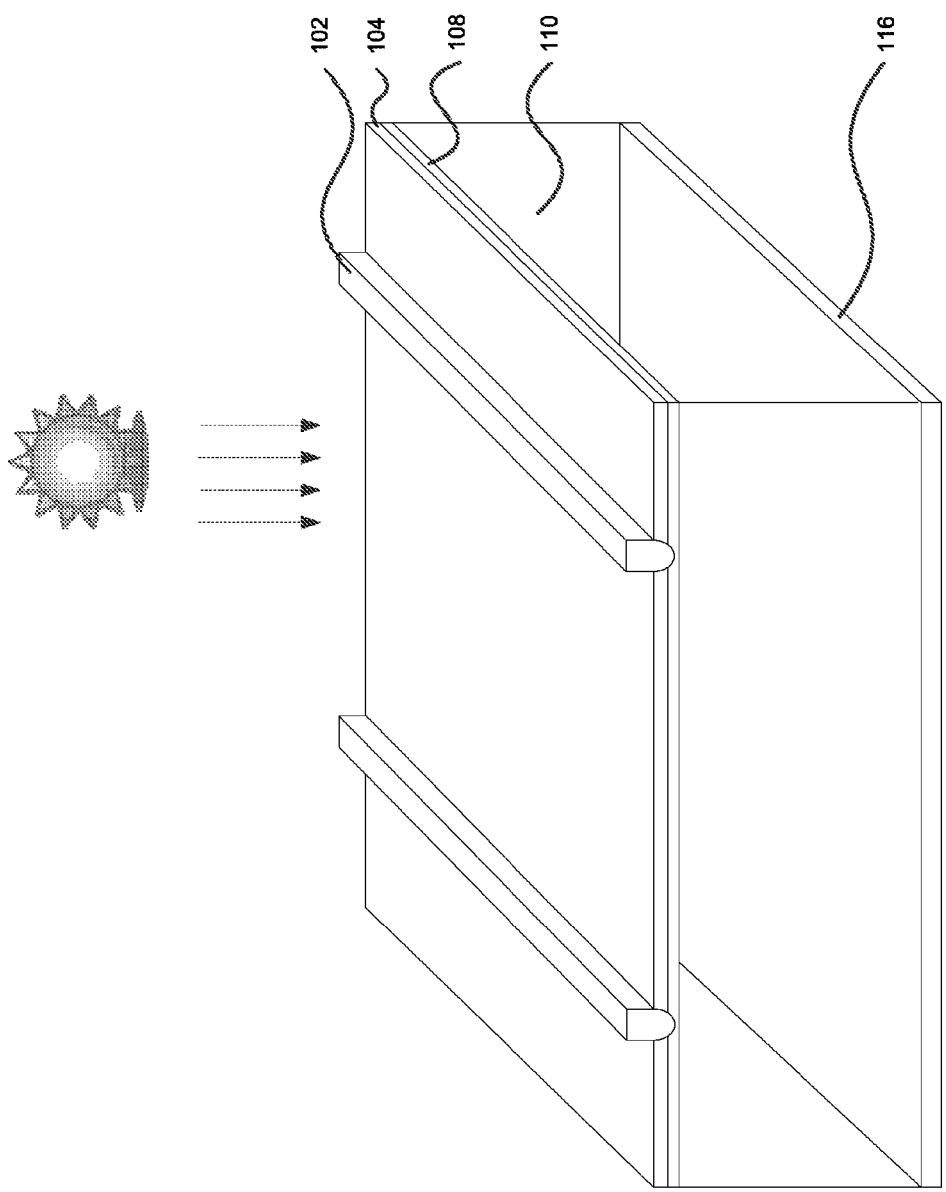
FIG. 1 shows a simplified diagram of a traditional front-contact solar cell.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, charge carrier recombination and reduced red spectrum response in traditional full area Al BSF solar cells is problematic. In an advantageous manner, a rear floating junction may be formed on a silicon substrate with a particle masking layer, such that a rear metal contact fired through the rear $SiN_x$ layer does not detrimentally shunt the solar cell.

In general, any particle material may be used that (1) does not substantially contaminate the silicon substrate, and (2) substantially attenuates or blocks ambient $POCl_3$ during the diffusion process. In addition, for configurations in which the particle masking layer is substantially removed prior to a silicon nitride deposition, a particle material that may be removed from the substrate using silicon substrate etchants, such as HF.

In one embodiment, a particle masking layer is deposited on the substrate backside, prior to both a phosphorous diffusion and a silicon nitride deposition. In another embodiment, the particle masking layer is deposited on the substrate backside, prior to a silicon nitride deposition and after a phosphorous diffusion.

In one configuration, the masking particles may comprise a silicon-containing material, such as Si, $SiO_x$, and $Si_xN_y$, where x and y are positive integers. In general, silicon-containing materials have similar etchant properties as the underlying substrate, and thus may be removed with typical solar cell manufacturing etchants. Additionally these silicon-containing materials may be treated post deposition to enhance their masking capability. This may be done by exposing to an oxidizing ambient (e.g. in a tube furnace or baking oven) or by chemically oxidizing them (e.g. exposing to $HNO_3$, $H_2O_2$ or other oxidizing chemistries). Due to the particle nature of these materials, they can be substantially oxidized without affecting the underlying substrate.

In an alternate configuration, the masking particles may comprise an oxide. In general, oxides which result in a greater reduction in free energy than the oxidation of silicon are thermodynamically stable in contact with silicon at an elevated temperature. As a result, no metallic impurities in the oxide that can degrade the minority carrier lifetime of the wafer will be introduced into the bulk of the wafer. Suitable ceramic materials include $TiO_2$, $Al_2O_3$, MgO, CaO, $Li_2O$, BeO, SrO, $Sc_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Tb_2O_3$, $Dy_2O_3$, $Ho_2O_3$, $Er_2O_3$, $Tm_2O_3$, $Yb_2O_3$, $Lu_2O_3$, $ThO_2$, $UO_2$, $ZrO_2$, and $HfO_2$. (K. J. Hubbard and D. G. Schlom, *Thermodynamic stability of binary metal oxides in contact with Silicon*, J. Mater. Reasearch, v 11 (11), 1996). Refer to U.S. patent application Ser. No. 13/099,794, entitled Ceramic Boron-Containing Doping Paste And Methods Therefore, the entirety of which is incorporated by reference.

In order to be deposited in a pattern on the substrate rear surface, the particle masking layer is generally deposited as a colloidal dispersion or paste. In general, the masking particles are dispersed in a set of solvents (such as alcohols, aldehydes, ketones, carboxylic acids, esters, amines, organosiloxanes, halogenated hydrocarbons, and other hydrocarbon solvents). In addition, the solvents may be mixed in order to optimize physical characteristics such as viscosity, density, polarity, etc.

Once formulated, the colloidal dispersion may be applied to a substrate and subjected to a heat treatment in order to sinter the set of masking particles into a densified film. Examples of application methods include, but are not limited to, roll coating, slot die coating, gravure printing, flexographic drum printing, and inkjet printing methods, etc.

In a typical solar cell diffusion process, in order to create the p-n junction, phosphorous is diffused into a boron doped silicon substrate in a quartz tube furnace with a $POCl_3$ (phosphorus oxychloride) ambient. The reaction is typically:

$$4POCl_{3(g)} + 3O_{2(g)} \rightarrow 2P_2O_{5(l)} + 6Cl_{2(g)} \quad \text{[Equation 1A]}$$

$$2P_2O_{5(l)} + 5Si_{(s)} \rightarrow 5SiO_{2(s)} + 4P_{(s)} \quad \text{[Equation 1B]}$$

$$Si + O_2 \rightarrow SiO_2 \quad \text{[Equation 2]}$$

The typical gases involved in a $POCl_3$ diffusion process include a carrier nitrogen gas (carrier $N_2$ gas) which is flowed through a bubbler filled with liquid $POCl_3$, a reactive oxygen gas (reactive $O_2$ gas) configured to react with the vaporized $POCl_3$ to form the deposition (processing) gas, and optionally a main oxygen gas (main $O_2$ gas) configured to later form an oxide layer.

A silicon substrate is generally placed in a heated tube furnace with a nitrogen gas ambient (main $N_2$ gas). The deposition gas ($POCl_3$ vapor) is then flowed into the tube furnace, heated to a deposition temperature, and exposed to reactive $O_2$ (oxygen) gas to form $P_2O_5$ (phosphorus pentoxide) on the silicon substrate front and rear surface, as well as $Cl_2$ (chlorine) gas that interacts with and removes metal impurities in the silicon substrate. $P_2O_5$ in turn reacts with the silicon substrate to form $SiO_2$, and free P atoms. The simultaneous oxidation of the silicon wafer during the deposition results in the formation of a $SiO_2.P_2O_5$ layer (PSG or phosphosilicate glass).

An additional drive-in step (free of any $POCl_3$ flow) is typically employed using the deposition temperature or a higher temperature in order to enable the free phosphorous atoms to diffuse further into the silicon substrate and substitutionally replace silicon atoms in the lattice in order to be available for charge carrier generation. During this step, ambient gas which may comprise of main $N_2$ gas and/or main $O_2$ gas is flowed into the tube furnace.

The front surface PSG and rear surface PSG would later be removed using an appropriate etchant, such as HF, the perimeter front substrate would be electrically isolated (usually by cutting a trench with a laser) from the rear surface in order to prevent shunting.

In an advantageous manner, a deposition of a set of masking particles may be used as an attenuating phosphorous mask, such that substrate areas below the set of particle masking layer have a lower phosphorous dopant concentration than the remaining exposed substrate areas.

Figure 3B:
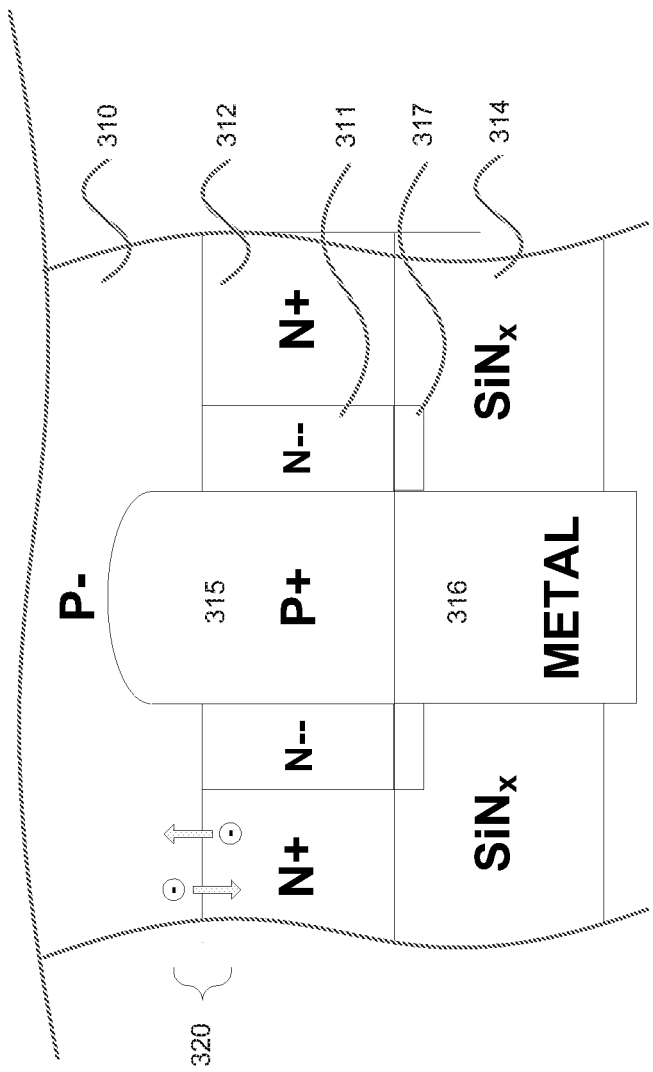

Referring to FIGS. 3A-B, a simplified set of diagrams of a front-contact solar cell with a rear floating junction in which a particle masking layer is deposited prior to a phosphorous diffusion, in accordance with the invention.

The particle masking layer 317 is deposited on the rear substrate surface in order to attenuate the ambient $POCl_3$ and subsequently create lightly-doped phosphorous region 311.

Silicon substrate 310 is then exposed to $POCl_3$ in order to form front heavily doped phosphorous (emitter) region 308, rear heavily doped phosphorous region 312, and rear lightly doped phosphorous region 311 (under the set of masking particles as previously described). The inventors believe that for optimal cell performance the surface concentration under lightly doped phosphorous region 311 less than $1e19\ cm^{-3}$ is preferable, less than $5e18\ cm^{-3}$ is more preferable, and less than $1e18\ cm^{-3}$ is most preferred.

Further the inventors believe that the p-type doping in the localized BSF region (peak doping typically between $1e18$ and $3e19\ cm^{-3}$) should be at all depths greater than the doping in lightly doped phosphorous region 311. If this is not the case then region 311 will tend to over dope BSF resulting in shunting of the rear floating junction. The surface concentration in the BSF greater that $5e18\ cm^{-3}$ is preferable, greater than $1e19\ cm^{-3}$ is most preferred. Finally, the surface concentration in the n+ floating junction 312 should be as low as possible to reduce the recombination within the floating junction. For a standard front side this surface concentration is limited by the amount of dopant required to form contacts to the front surface. In this case dopant concentration between about $1e20\ cm^{-3}$ and about $5e20\ cm^{-3}$ is preferable.

After diffusion, the front surface PSG and rear surface PSG may be removed using HF followed by front $SiN_x$ layer 304 and rear $SiN_x$ layer 314 being deposited. The inventors believe that for optimal contact formation with Al paste (containing no frit) on the rear side the $SiN_x$ refractive index should be preferably between about 2.2 and about 2.4, or more preferably between about 2.3 and about 2.4. The front side $SiN_x$ should have a refractive index of between about 2.0 and about 2.1, and more preferably between about 2.05 and about 2.1. The set of metal contacts, comprising front-metal contacts 302 and back metal contacts 316, are then sequentially formed on and subsequently fired into substrate 310.

Furthermore, in the case of the rear surface, rear metal contact 316 (generally aluminum with a boron dopant) forms highly doped p-type (BSF) region 315 in substrate 310. Consequently, a non-shunting contact with boron doped silicon substrate 310 is formed through particle masking layer 311. Finally the front and rear junction are isolated from each other using a laser scribed groove.

Figure 2:
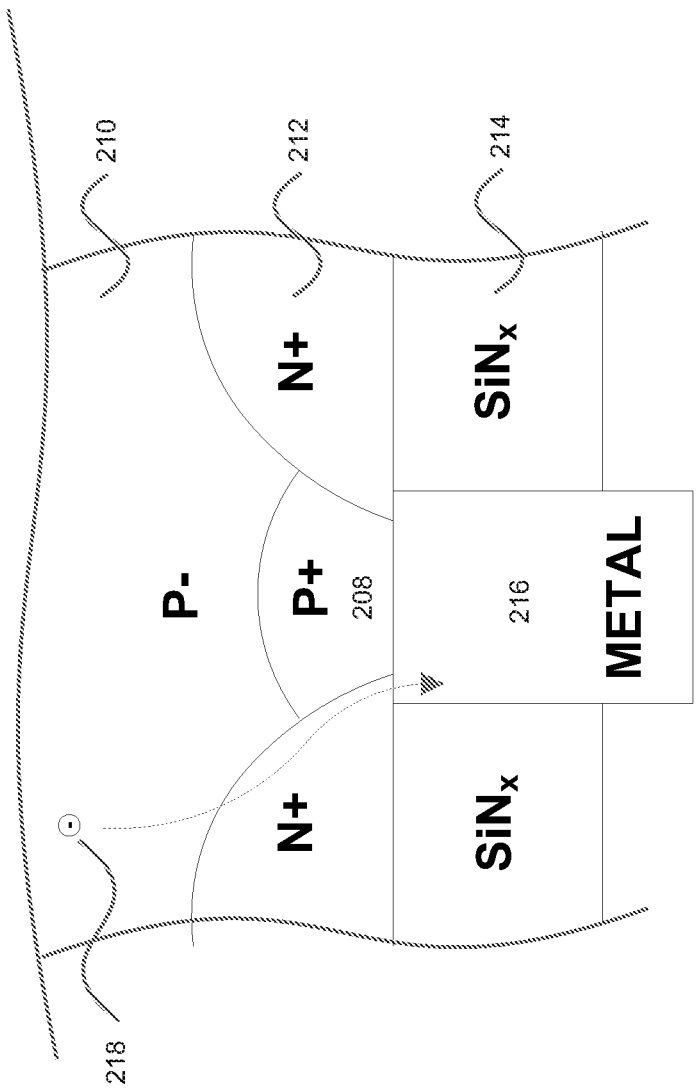
FIG. 2 shows a simplified diagram of a passivated layer/reduced area metal contact solar cell configuration with detrimental shunting.

However, unlike the rear substrate surface of FIG. 2 above, the combination of the electrical isolation of front heavily doped phosphorous (emitter) region 308 from rear heavily doped phosphorous region 312, and the electrical isolation of rear heavily phosphorous-doped region 312 to back metal contacts 316, enables rear heavily doped phosphorous region 312 to function as a floating junction which further passivates the rear substrate surface.

That is, since rear heavily doped phosphorous region 312 is electrically isolated, it remains in equilibrium, such that the net current 320 from and to it is zero. The electron drift current and the electron diffusion current, as well as the hole drift current and the hole diffusion current, must balance out in order to prevent a net buildup of electrons and/or hole either side of the junction between rear heavily doped phosphorous region 312 and doped substrate 310. Hence, rear surface recombination is substantially minimized.

Furthermore, the removal of the full area rear layer of aluminum allows much of the long wavelength light that has not already been absorbed to be reflected back into the cell, allowing additional charge carriers to be generated, which in turn, increases generated current. This internal reflection of long wavelength light may be further enhanced by coating the rear side of the cell with a reflective material such as a thin layer of silver, white paint or by placing the cell in proximity (e.g. when encapsulated) to a reflective white surface such as a sheet of tedlar.

EXPERIMENT 1

Figure 4:
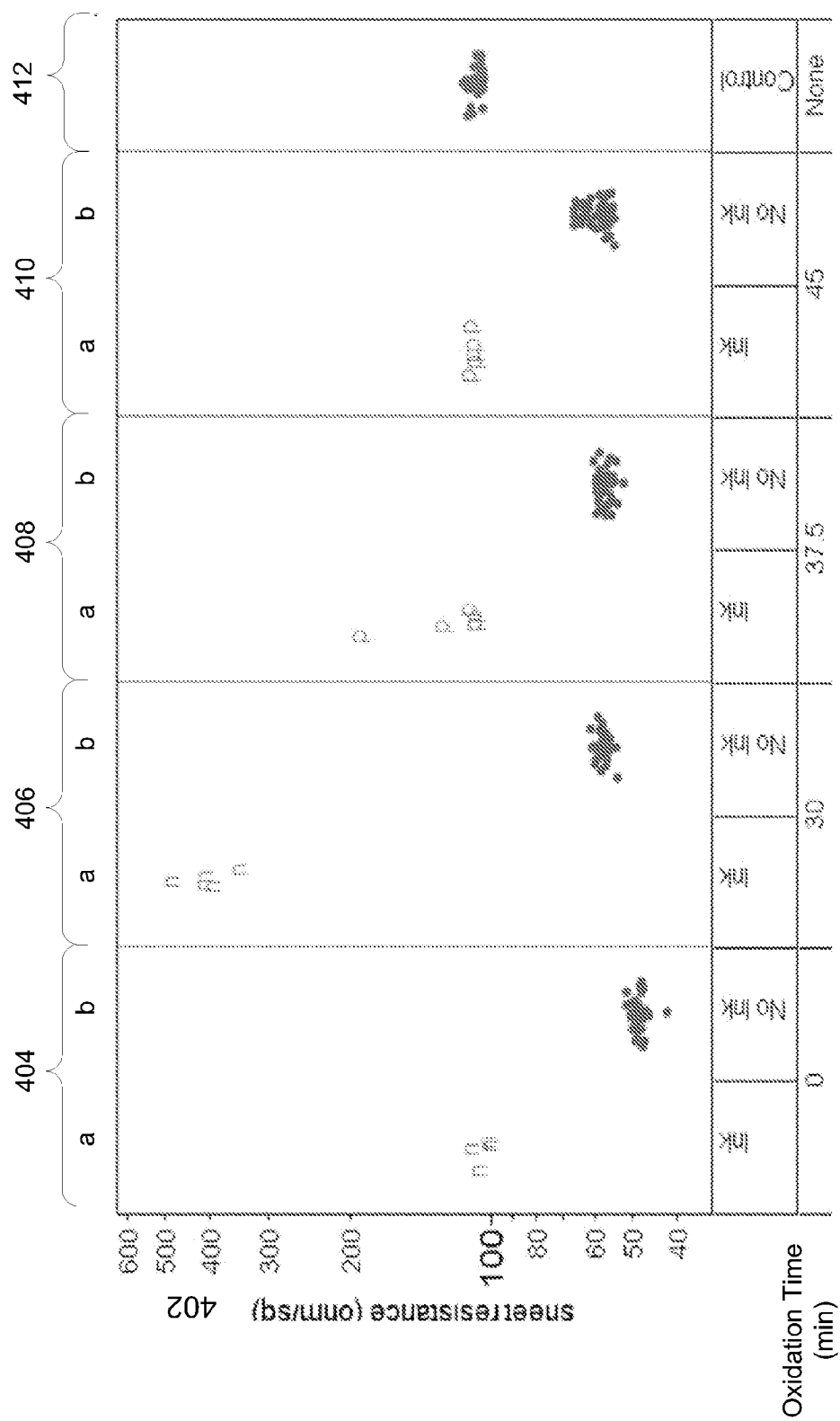
FIG. 4 compares the sheet resistances of both masked and unmasked regions of five sets of silicon substrates exposed to different amounts of low temperature oxidation before phosphorous diffusion, in accordance with the invention.

Referring now to FIG. 4, the sheet resistances comparing both masked and unmasked regions of five sets of silicon substrates exposed to different amounts of low temperature oxidation before phosphorous diffusion, in accordance with the invention. Hot probe determination of the polarity is shown using "n" for phosphorous doped regions and "p" for boron doped regions.

Here, patterned patches of silicon-containing masking particles were deposited onto a set of mono-crystalline silicon substrates such that only portions of the surface are covered.

After the deposition of the set of the silicon-containing masking particles, the substrates were baked at 400° C. in a tube furnace for 8 minutes to remove residual solvents. The substrates were then pre-oxidized in a quartz diffusion tube by processing at 850° C. with a gas flow consisting of 50% oxygen and 50% nitrogen for four different periods (0 minutes, 30 minutes, 37.5 minutes, and 45 minutes). After pre-oxidation the gas flow was changed to included $POCl_3$ doping gas at 850° C. for 20 minutes. The samples were loaded and unloaded under nitrogen at 800° C. After diffusion the surface oxide (including PSG layer) was removed using a 2 minute dip in 6:1 BOE.

The effect of pre-oxidation on the doping strength under the set of particle masking layer regions is clearly demonstrated. When no oxidation step is performed the doping under the particle masking layer is n-type 100 Ohm/sq. However, with the use of pre-oxidation the doping strength is reduced to n-type 400 Ohm/sq with 30 minutes oxygen at 850° C. and then completely blocked for 37 minutes (i.e., silicon turns p-type) at 850° C.

The data shown here used a furnace for pre-oxidation, however the authors believe that this step could also be performed using a chemical dip on the set of masking particles coated side of the wafer and/or the use of an oxidation ambient during bake after printing the set of masking particles.

EXPERIMENT 2

Figure 5:
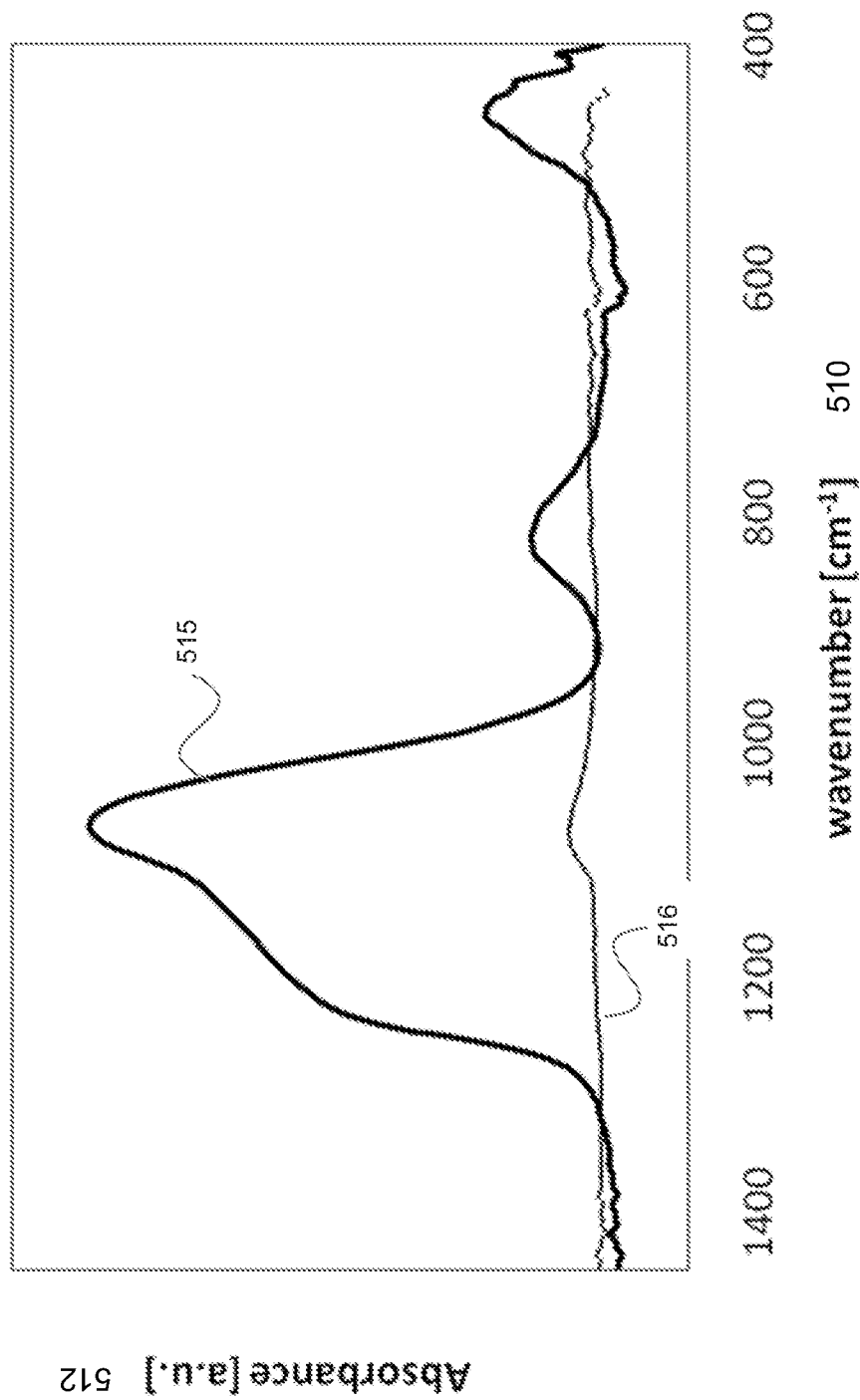
FIG. 5 shows a simplified diagram of FTIR (Fourier Transform Infra-Red) spectra for a silicon-containing set of masking particles deposited on a double-sided polished monocrystalline silicon substrate, in accordance with the invention.

Referring now to FIG. 5, a simplified diagram of FTIR (Fourier Transform Infra-Red) spectra for a double-sided polished mono-crystalline silicon substrate, with a resistivity of about 10000 Ohm-cm, upon which a set of silicon-containing masking particles was deposited, in accordance with the invention. The first spectrum 516 shows the absorbance of substrate areas without deposited set of masking particles, while the second spectrum 514 shows the absorbance of substrate areas with deposited set of masking particles.

In general, Fourier transform spectroscopy is a measurement technique whereby spectra are collected based on measurements of the temporal coherence of a radiative source, using time-domain measurements of the electromagnetic radiation or other type of radiation 510 (shown as wave number on the horizontal axis). At certain resonant frequencies characteristic of the chemical bonding within a specific sample, the radiation 512 will be absorbed (shown as absorbance A.U. on the vertical axis) resulting in a series of peaks in the spectrum, which can then be used to identify the chemical bonding within samples. The radiation absorption is proportional the number of bonds absorbing at a given frequency.

Here, patterned patches of the set of silicon-containing masking particles were deposited onto a set of polished mono-crystalline silicon substrates such that only portions of the surface are covered.

After deposition the samples were baked at 400° C. in a tube furnace for 8 minutes to remove residual solvents. The samples were then loaded in a quartz diffusion tube at 800° C. in nitrogen ambient. After loading, the samples were subjected to a gas flow consisting of 5% oxygen and 95% nitrogen for 1 minute. The samples were loaded and unloaded under nitrogen at 800° C.

First spectrum 516 and second spectrum 515 show peaks around 450 cm$^{-1}$, 800 cm$^{-1}$, and 1100 cm$^{-1}$ that are characteristic of Si—O (silicon oxygen single bonding), all typical of silicon dioxide films. The absorbance of the second (masking particle) spectrum 515 is substantially greater than the absorbance of the first (non-masking particle) spectrum 516, indicating that the patterned areas are significantly more oxidized than the non-patterned areas.

The FTIR of the masking particle region versus the non-masking particle region shown in FIG. 5 clearly demonstrates the formation of oxide in the masking particle region while negligible formation on the wafer surface. The inventors believe that selectively oxidizing silicon-containing masking particles prior to POCl$_3$ deposition attenuates diffusion in patterned areas while negligibly attenuating non-patterned areas.

EXPERIMENT 3

Figure 6:
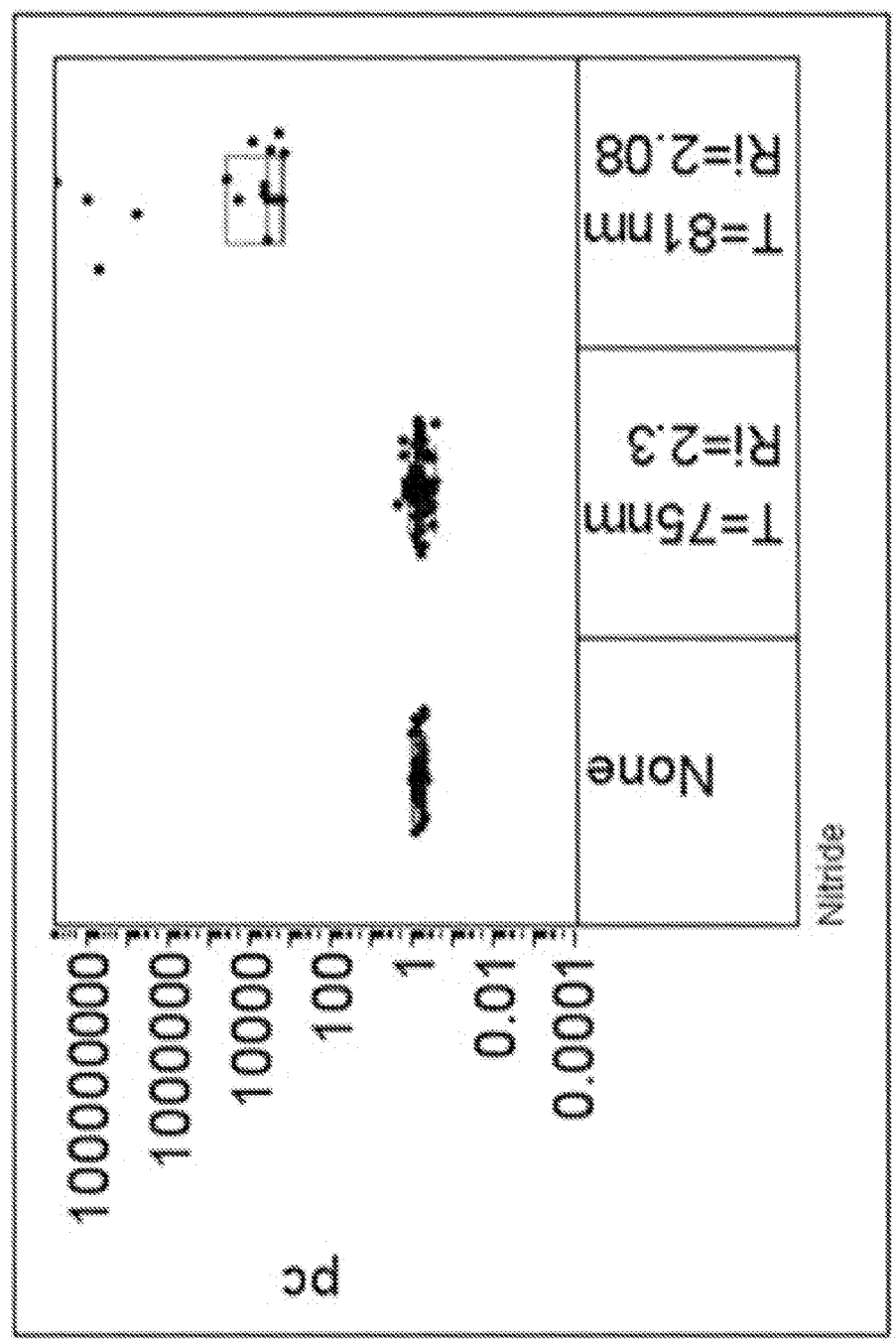
FIG. 6 shows a simplified diagram of specific contact resistivity for an Al paste fired through a rear $SiN_x$ to form an ohmic contact with the silicon substrate, in accordance with the invention.

Referring to FIG. 6, a simplified diagram is shown demonstrating that an Al paste may be fired through rear SiN$_x$ to form an ohmic contact with the silicon substrate. Samples with different nitride layers were screen printed with Al fingers, fired to form ohmic contact to the base, then cut into strips with a laser and characterized with the transmission line measurement (TLM) to extract values of contact resistance.

Substrates were prepared on p-type, 2 Ohm-cm CZ silicon wafers. The surface of the substrates was first etched in HF:HNO$_3$ to remove residual saw damage then cleaned in a mixture of 6:1 BOE prior to nitride deposition. On a third of the substrates, as SiN$_x$ was deposited with a refractive index of about 2.08 and a thickness of about 81 nm. Upon another third of the substrates, a SiN$_x$ was deposited with a refractive index of about 2.3 and a thickness of about 75 nm. On the remaining third of the substrates, SiN$_x$ was deposited.

The properties of the SiN$_x$ layers were measured using an elipsometer on polished reference samples that ran through the same recipe. Substrates were then screen printed with an H-bar pattern (fingers and two busbars) of standard aluminum BSF paste. The samples were fired at a peak temperature of 740° C. with a time over 700° C. of about 1.5 seconds. After firing, the substrates were cut into 5 mm wide strips at right angles to the finger direction and characterized using transmission line measurements (TLM).

The contact resistance achieved by firing Al BSF paste through different SiN$_x$ recipes is shown in FIG. 6. For the samples without a SiN$_x$ layer the specific contact resistivity is around 1 mOhm.cm$^2$. Substrates with the high SiN$_x$ refractive index (about 2.3) also have a similarly low specific contact resistivity. This indicates that the aluminum was successfully able to penetrate the SiN$_x$ layer and form good ohmic contact with the wafer bulk. The samples with the lower SiN$_x$ refractive index (about 2.08) did not form good ohmic contact. Thus the inventors believe that to fabricate solar cells in the described invention it is necessary for the rear SiN$_x$ to have a high refractive index (i.e., a high silicon content).

EXPERIMENT 4

Figure 7A:
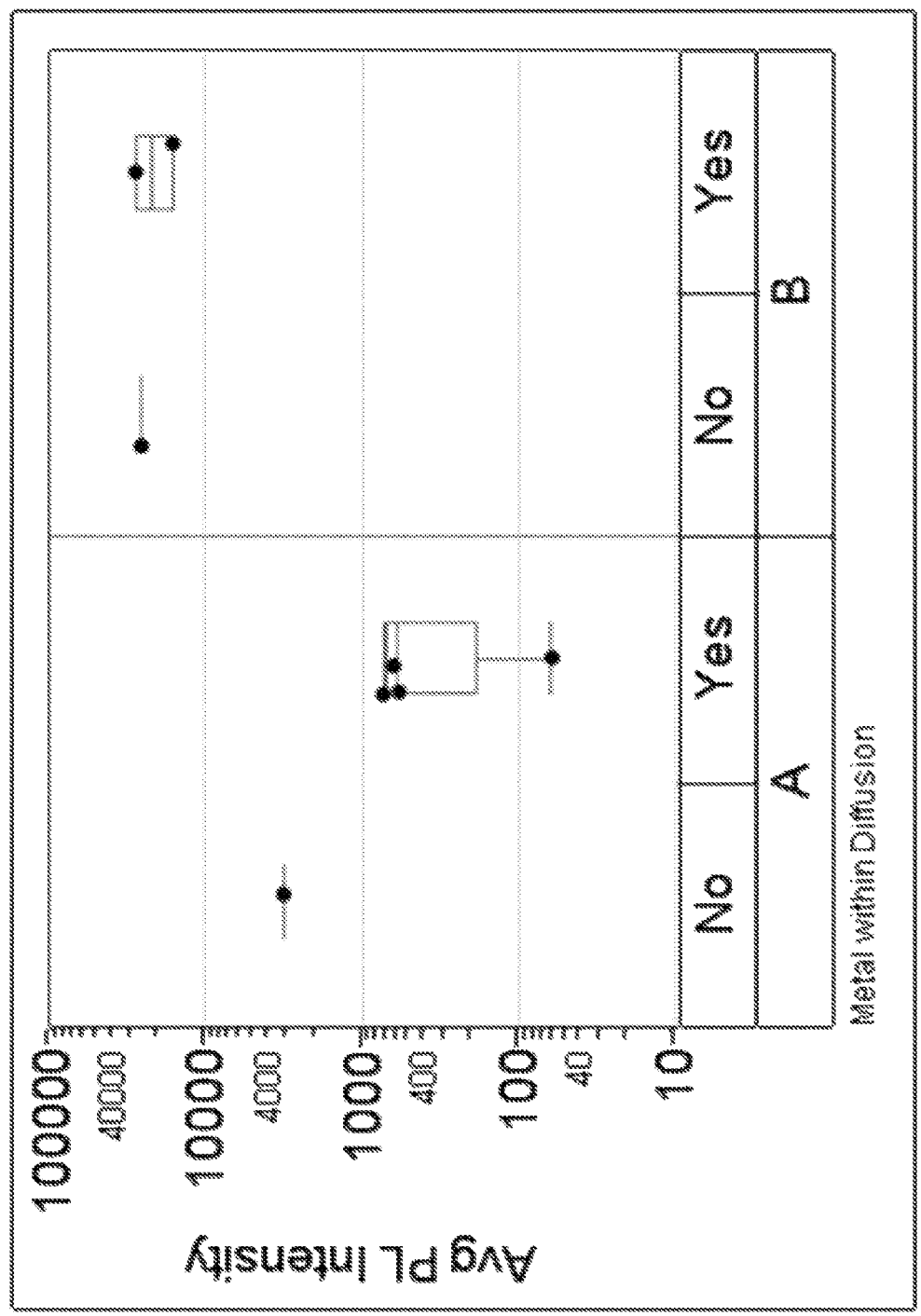
FIGS. 7A-C show a set of diagrams characterizing the effect of the metal contact formation on the passivation quality of a floating junction, in accordance with the invention.
Figure 7B:
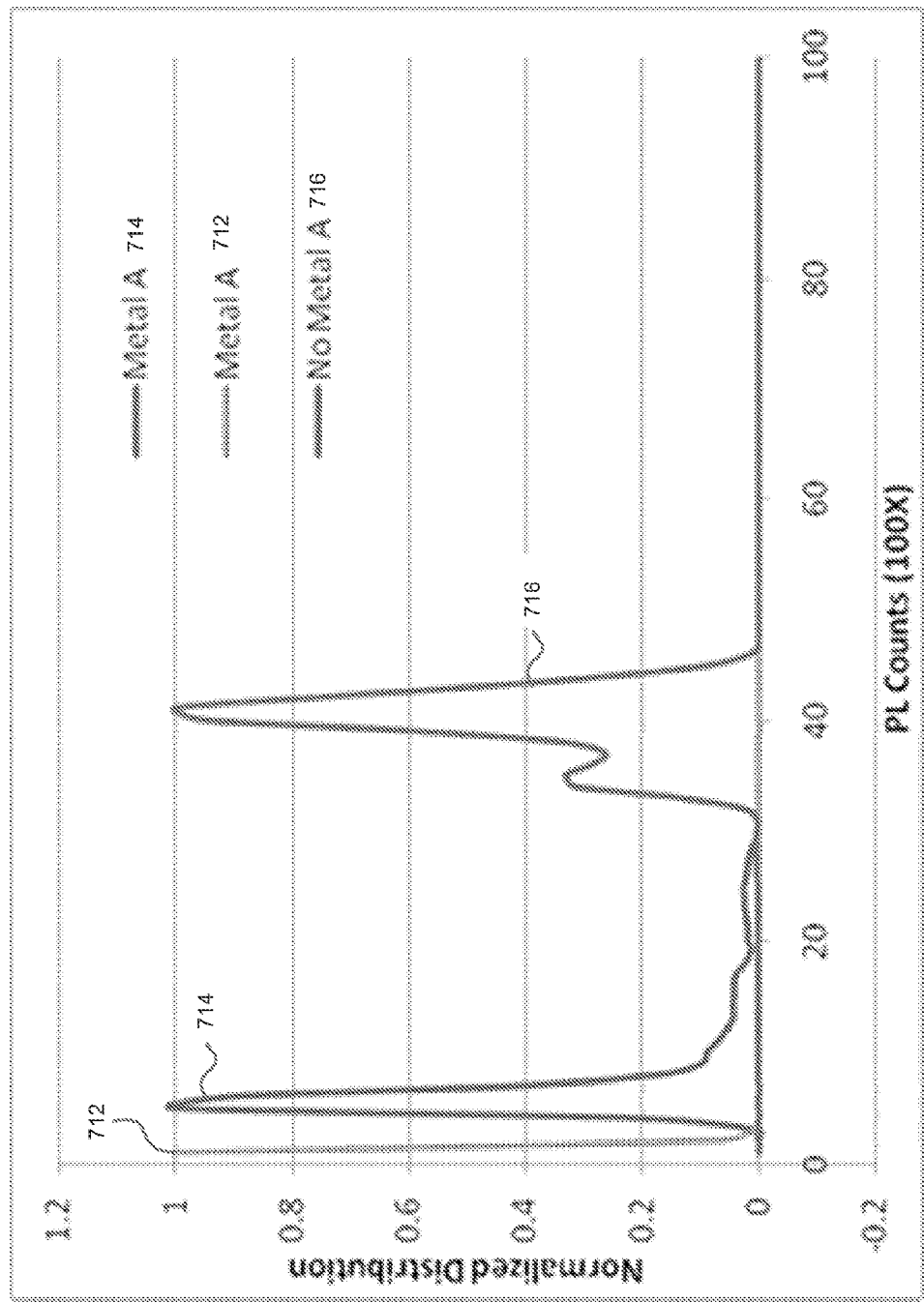
Figure 7C:
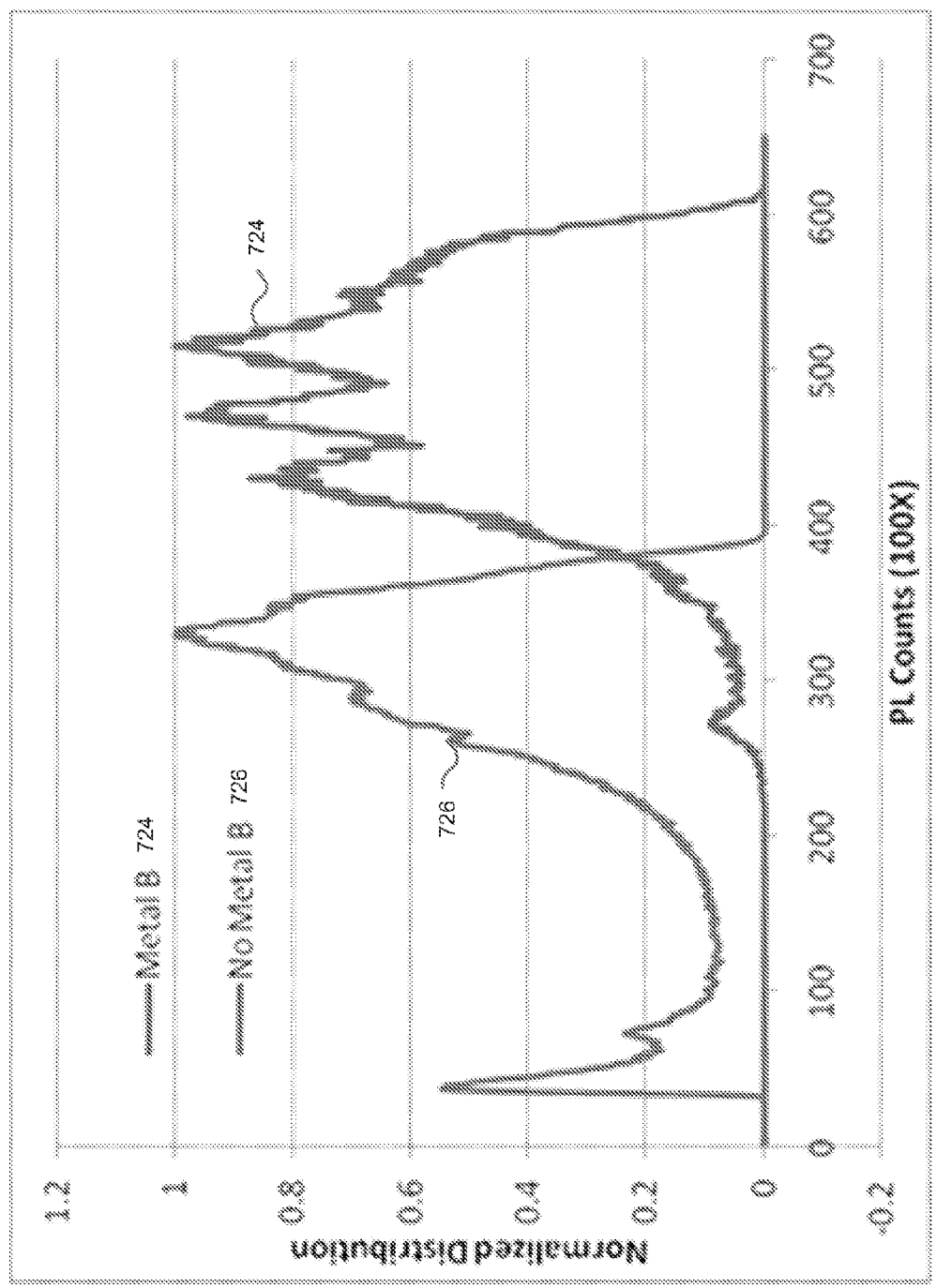
Figure 7D:
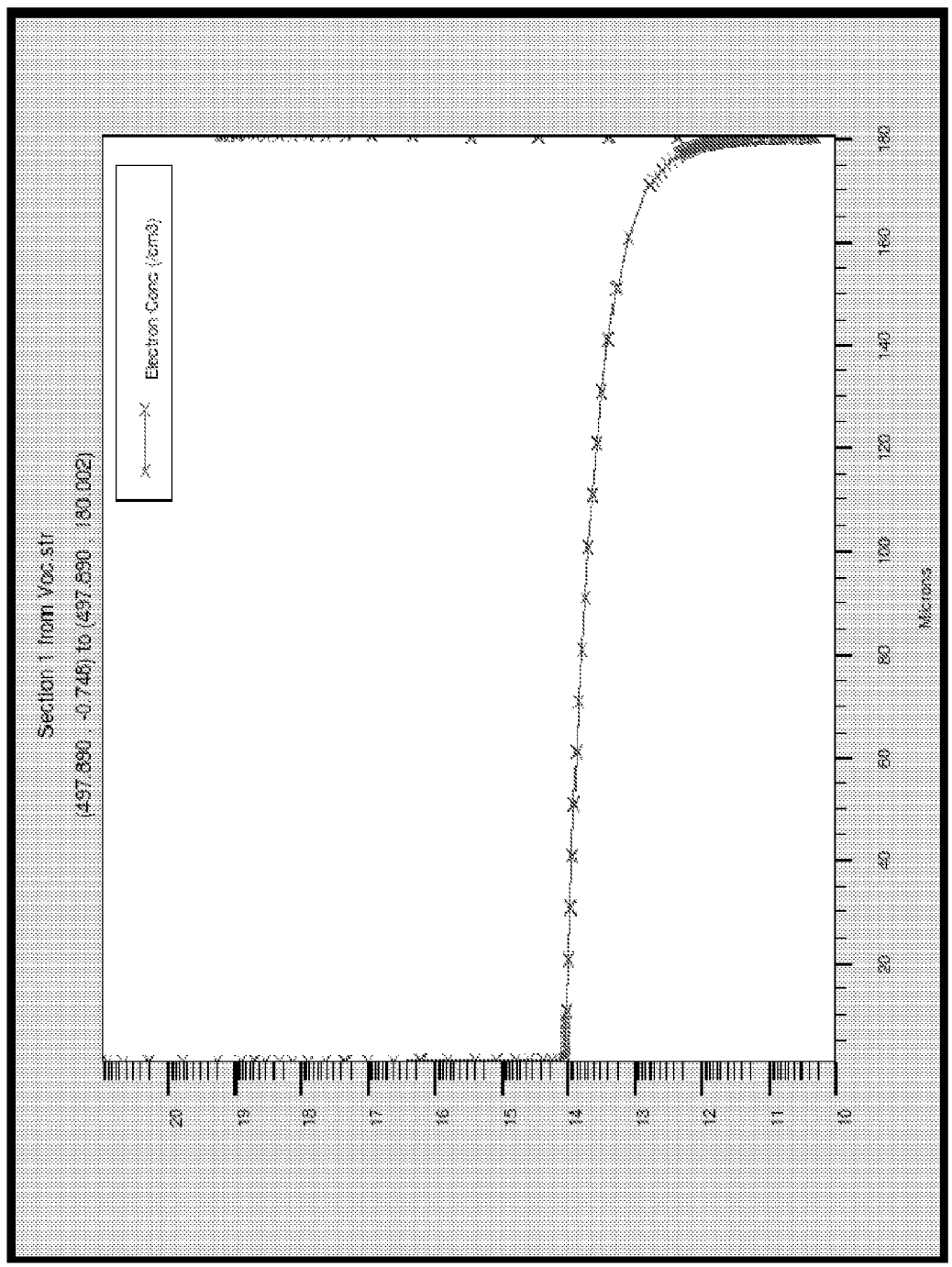
FIGS. 7D-E show a set of diagrams, plotting electron carrier concentration as a function of depth, in accordance with the invention; and, FIGS. 8A-E show a simplified process for manufacturing a front-contact solar cell with a rear floating junction in which a particle masking layer is deposited prior to a phosphorous diffusion, in accordance with the invention.
Figure 7E:
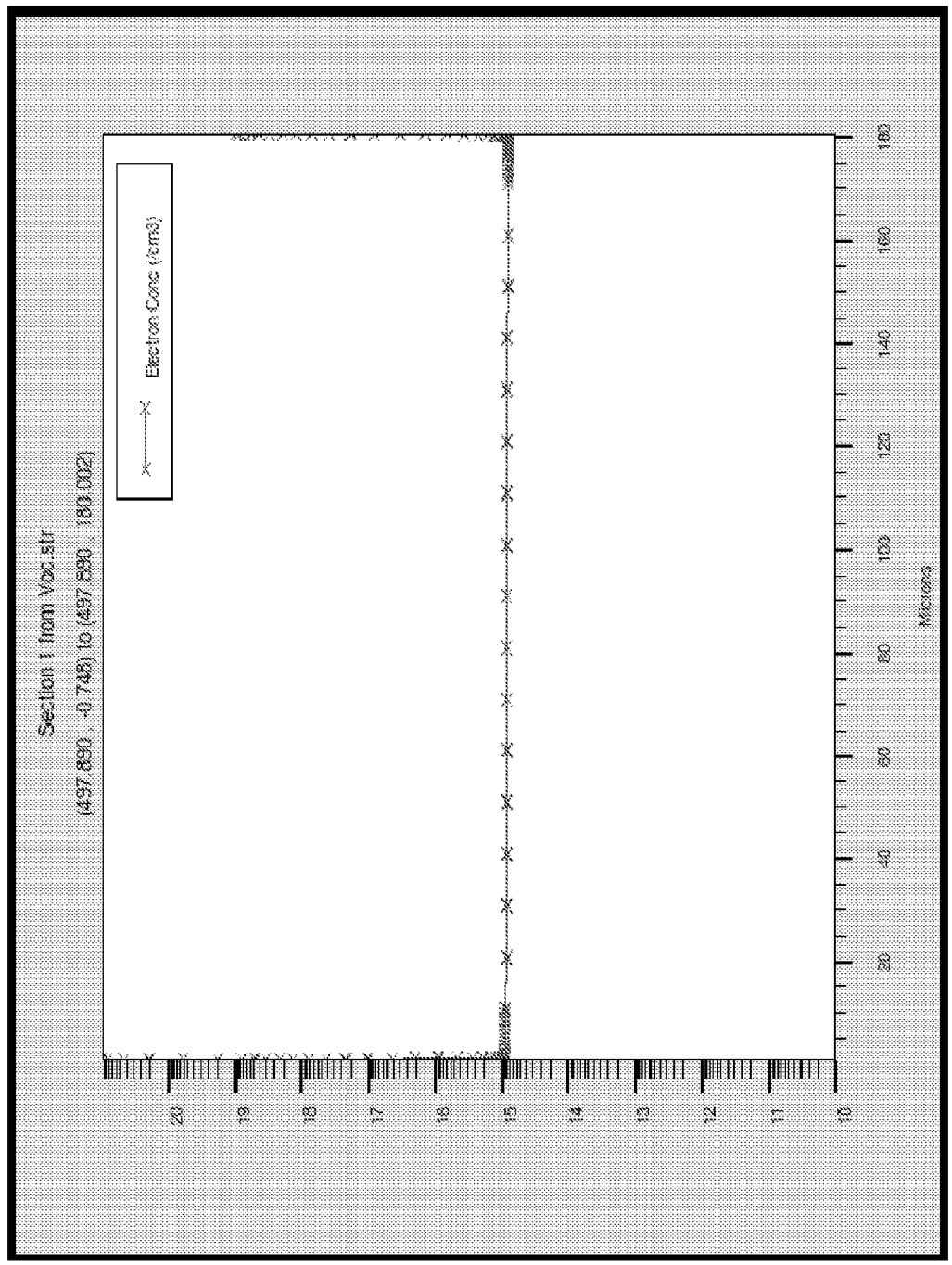

Referring to FIGS. 7A-C, a set of diagrams characterizing the effect of the metal contact formation on the passivation quality of a floating junction, in accordance with the invention.

A set of sample regions were prepared on p-type, 2 Ohm.cm CZ silicon wafers. The surface of the wafers was first etched in HF:HNO$_3$ to remove residual saw damage then cleaned in a mixture of HF:HCl prior to diffusion. In addition, in half of the sample regions, an array of aluminum dots was deposited in order to create localized BSF regions A first set of silicon substrates were loaded into a quartz tube furnace and processed with POCl$_3$ doping gas at 800° C. for about 20 minutes. Subsequently, a second set of silicon substrates were loaded into a quartz tube furnace and processed with POCl$_3$ doping gas at 750° C. for about 25 minutes. All of the silicon substrates were loaded and unloaded under nitrogen at the corresponding deposition temperature.

After diffusion, the PSG layer was removed using a 6:1 BOE for 2 minutes, followed by a deposition of nitride on the front and rear of the cell. The rear nitride was selected to allow penetration of aluminum through during firing, the refractive index was about 2.35 with a thickness of about 80 nm. Some of the cells were then screen printed with an array of 200 um aluminum dots while others were left unprinted. All samples were fired at 740° C. with a time of 1.5 s over 700° C. (similar to the process used in Experiment 3 above).

PL imaging [T. Trupke, et al. Applied Physics Letters 89, 44107-1-3 (2008)] was then used to characterize the relative change in minority carrier density in the samples. A four point probe was used to assess the diffusion strength.

To characterize the effect of the metal contact formation on the passivation quality of the floating junction a PL (photoluminescence) imaging tool was used to measure the relative change in minority carrier concentration in the bulk. PL imaging uses an 815 nm laser to excite carriers in the sample and a cooled silicon CCD camera to capture an image of the emission of light from recombining carriers in the silicon bulk.

The signal strength has been shown to be proportional to the number of minority carriers in the bulk under the steady state conditions reached with constant illumination. After the images were taken, image processing was used to calculate the average number of counts in the 1024×1024 pixel image. This average number (shown in FIG. 7A) is presented here to demonstrate the relative change in minority carrier density (and hence the recombination) in each sample.

In addition, a section through the middle of each image (200×700 pixels) was selected to generate a histogram of the distribution of the counts, and provide additional insight into any change in surface passivation within a smaller region of the samples. The region was selected to not include the edges of the device where diffusion and firing non-uniformities may be more prevalent. The diffusion strength of the samples was also measured in 49 points across the samples using a four point probe. The average values of sheet resistance and PL intensity are shown on the FIG. 7A, the histograms are presented in FIGS. 7B-C.

The samples diffused with a heavy emitter (similar to that used to form the collecting junction in standard screen print cells) show a greater than 4× reduction in the average PL intensity when metal is fired through the rear side. They also show a shift to lower intensity in the histogram.

By comparison, the samples with the light diffusion (similar to that achieved under the patterned areas 406 in FIG. 4 show no reduction in average PL intensity and a shift to higher intensity on the histogram. This demonstrates that the passivation of that surface is not compromised by shunting from the aluminum contacts to the bulk when the diffusion strength in the region of the Al BSF is reduced. Thus the inventors believe that by using a similar doping strength in the region of the rear patterned regions the floating junction passivation can be maintained.

Referring to FIGS. 8A-E, a simplified process is shown for manufacturing a front-contact solar cell with a rear floating junction in which a silicon-containing masking particle material is deposited prior to a phosphorous diffusion, in accordance with the invention.

Figure 8A:
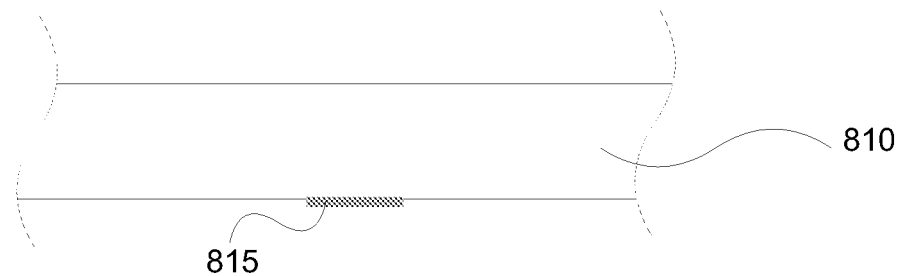

FIG. 8A shows a simplified diagram of a boron doped silicon substrate 810 after the deposition of particle masking layer 815 on the rear substrate surface. Substrate can be textured in either alkaline etching solutions (e.g. KOH:IPA) or in isotropic etchant (e.g. $HNO_3$:HF) to enhance trapping of light.

In general, masking particles may be deposited using inkjet printing, screen printing or other ink printing techniques. In addition, the pattern of deposited masking particles may be comprised of continuous lines or individual non-continuous shapes such as circles, squares or rings of ink. The pattern may further comprise of an H-bar pattern similar to the front Ag grid, a set of fingers or most preferably an array of shapes (e.g dots). In general, dot patterns should be preferably between 100 um and 500 um in diameter or more preferably between about 200 um and about 400 um, or most preferably 300 um. Furthermore, the spacing between deposited dots should be about 1 mm apart and equally spaced.

The thickness of the deposited particle masking layer should be between about 100 nm and about 2 μm, and more preferably between about 100 nm and about 500 nm. The particle masking layer printed on the rear side is designed to locally reduce the local doping strength; masking particles capable of doing this include but are not limited to colloidal dispersions composed of non-silicon containing particles such as $Al_2O_3$ as demonstrated in U.S. patent application Ser. No. 12/656,710, filed Feb. 12, 2010, entitled Methods of Forming a Multi-Doped Junction with Silicon-Containing Particles.

Another approach to reduce the local doping strength under the set of particle masking layer patterns is to print the particle masking layer in conjunction with an oxidation step prior to a $POCl_3$ diffusion process. Yet another approach to reduce the local doping strength under the set of particle masking layer patterns is to increase the thickness of the particle masking layer.

Optionally after particle masking layer deposition, the substrates may be baked to remove residual solvent in the film. For example the film may be baked using an inline belt oven at a temperature of about 200° C. for 30 about seconds. An ambient containing $O_2$ may also be used to preferentially oxidize the film to aid in the reduction of doping strength in those regions. After baking the samples may be processed with a wet chemical clean to remove impurities, examples include SC1, SC2 and HF based cleaning. Optionally an oxidizing chemical process may be used to preferentially oxidize the film to aid in the reduction of doping strength in those regions. Examples include mixtures containing $HNO_3$, $H_2O_2$ and $H_2SO_4$.

Figure 8B:
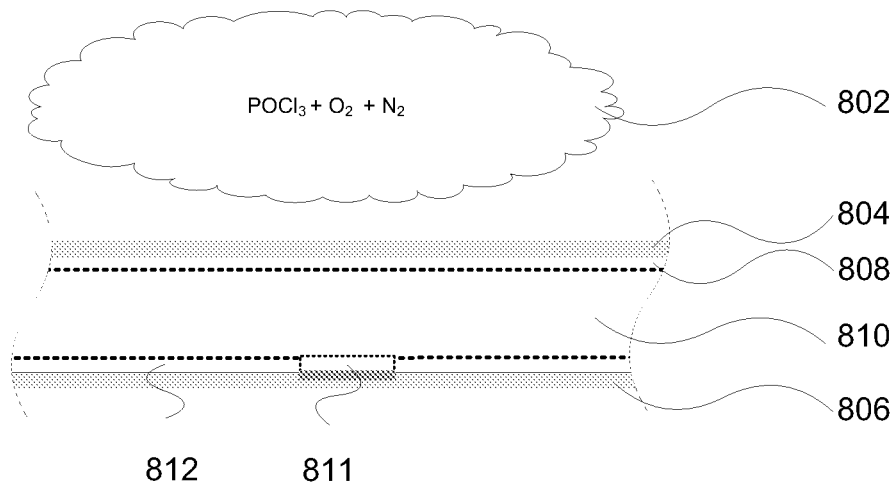

Next, in FIG. 8B, boron doped silicon substrate 810 is exposed to a $POCl_3$ ambient 802 as previously described. Consequently, front heavily doped phosphorous region 808, rear heavily doped phosphorous region 812, and lightly doped phosphorous region 811, are created in the substrate. The inventors believe that for optimal cell performance the surface concentration under the particle masking layer 811 less than $1e19\ cm^{-3}$ is preferable, less than $5e18\ cm^{-3}$ is more preferable and less than $1e18\ cm^{-3}$ is most preferred.

Such dopant concentrations can be achieved under particle masking layer patterns in conjunction with a $POCl_3$ diffusion process using a deposition temperature in the range to between 800° C. and 900° C., or more preferably between 840° C. and 890° C. and most preferable at 850° C. with POCl3 deposition times between about 10 minutes and about 40 minutes.

Figure 8C:
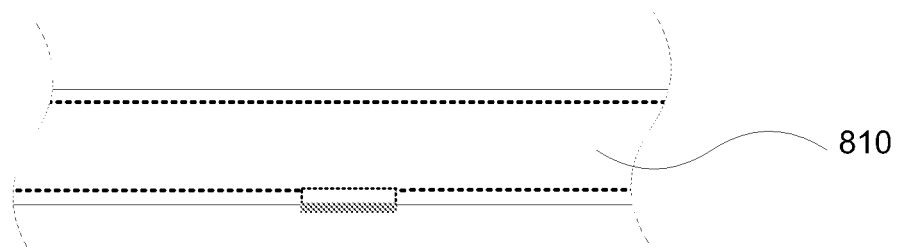
Figure 8D:
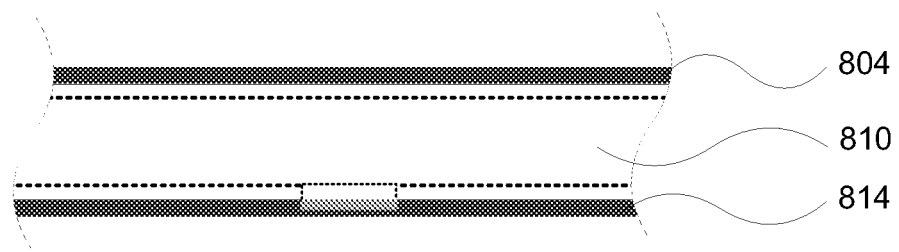

Next in FIG. 8C, PSG, formed as part of the $POCl_3$ diffusion process is removed using appropriate etchants, such as such as hydrofluoric acid (HF). Next in FIG. 8D, front $S_iN_x$ layer 804 and rear $S_iN_x$ layer 814 are deposited in order to passivate both the front and rear substrate surfaces, as well as to allow more photons to be captured and converted into charge carriers by doped silicon substrate 810. The inventors believe that for optimal contact formation with Al paste (containing no frit) on the rear side the $S_iN_x$ refractive index should be between about 2.2 and about 2.4, or more preferably between about 2.3 and about 2.4. The thickness of the rear $S_iN_x$ should be between about 20 nm and about 200 nm, or more preferably between about 40 nm and about 100 nm. The front side nitride should have a refractive index of between about 2.0 and about 2.1, or more preferably between about 2.05 and about 2.1. The thickness of the front $S_iN_x$ should be optimized to reduce reflection of incoming photons, for example on a random pyramid wafer a refractive index of about 2.05 with a thickness of about 100 nm (as measured using a polished Si wafer).

Figure 8E:
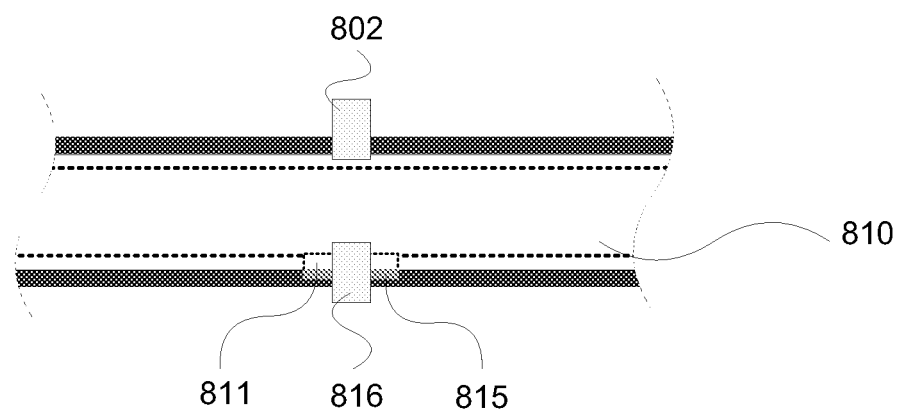

Finally in FIG. 8E, front metal contact 802 and rear metal contact 816 are formed as previously described. In the case of the rear surface, rear metal contact 816 is fired through $SiN_x$ layer 814 in order to both form a localized aluminum BSF and make a non-shunting contact with boron doped silicon substrate 810 (through lightly doped phosphorous region 811 and the set of particle masking layer patterns 815).

The inventors believe that the p-type doping in the BSF region (peak doping typically between $1e18$ and $3e19\ cm^{-3}$) should be at all depths greater than the doping in the n-type region 811. If this is not the case, then region 811 will tend to overdope BSF resulting in shunting of the rear floating junction. The surface concentration in the BSF greater that $5e18\ cm^{-3}$ is preferable, greater than $1e19\ cm^{-3}$ is most preferred. Finally the surface concentration in the n+ floating junction 812 should be as low as possible to reduce the recombination within the floating junction. For a standard front side this surface concentration is limited by the amount of dopant required to form contacts to the front surface. In this case, dopant concentration between about $1e20\ cm^{-3}$ and about $5e20\ cm^{-3}$ is preferable. When a selective emitter front side is used then the surface concentration of the field diffusion should be lower, between about $1e19\ cm^{-3}$ and about $1e20\ cm^{-3}$ is preferable, between about $1e19\ cm^{-3}$ to $5e19\ cm^{-3}$ is most preferred.

The rear metal should be printed in a pattern that matches the set of particle masking layers 815 deposited on the rear side. In general the printed width of the aluminum should be smaller than the deposited particle masking layer width to ensure that the aluminum is printed entirely within the set of particle masking layer patterns. For example with 300 um diameter ink dots the aluminum should be printed with a diameter of about 100 um, subsequently allowing for alignment tolerance, screen distortion etc.

Figure 9A:
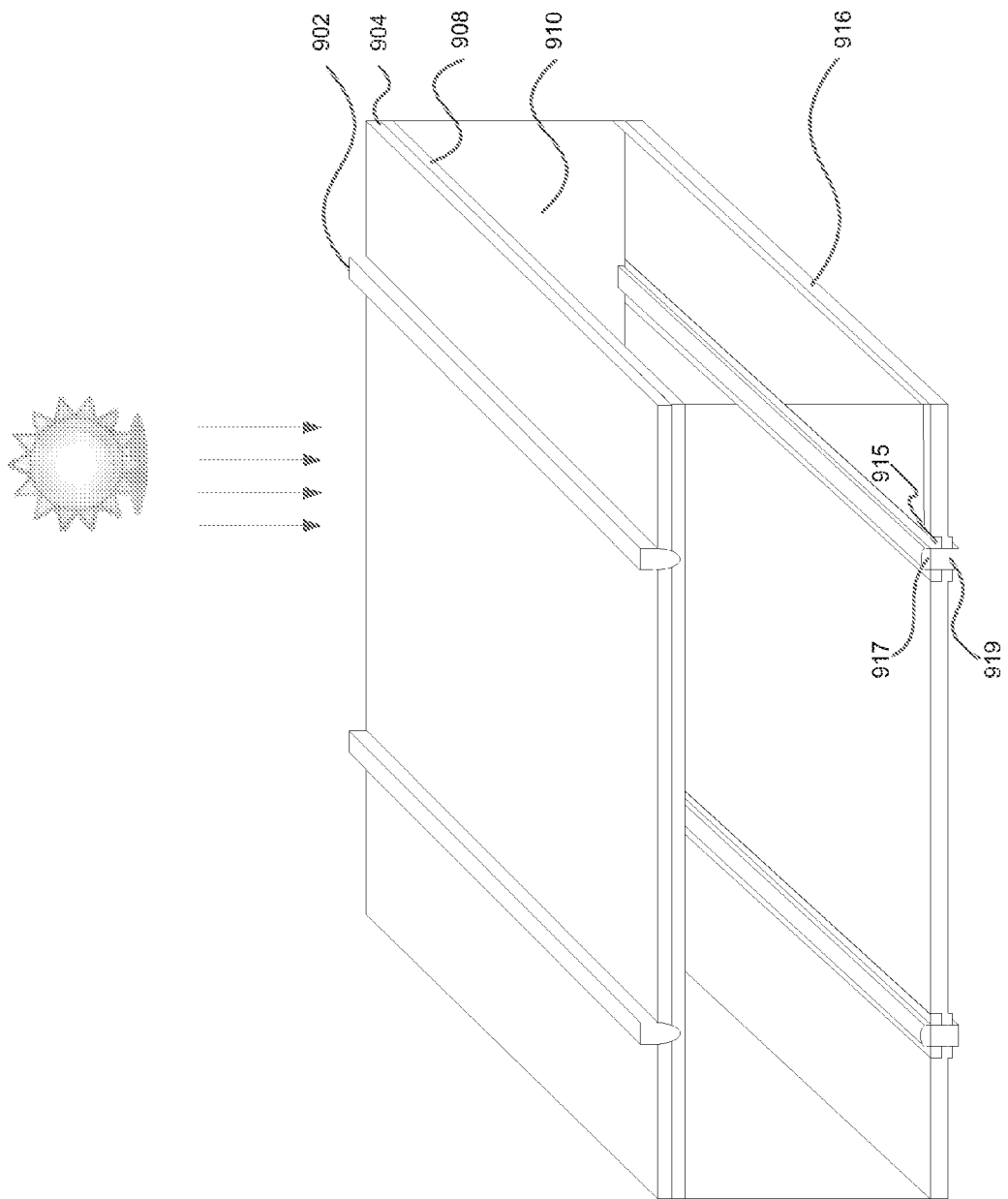
FIGS. 9A-B show a simplified set of diagrams of a front-contact solar cell with a rear floating junction in which a particle masking layer is deposited after the rear phosphorous diffusion is substantially removed, in accordance with the invention.
Figure 9B:
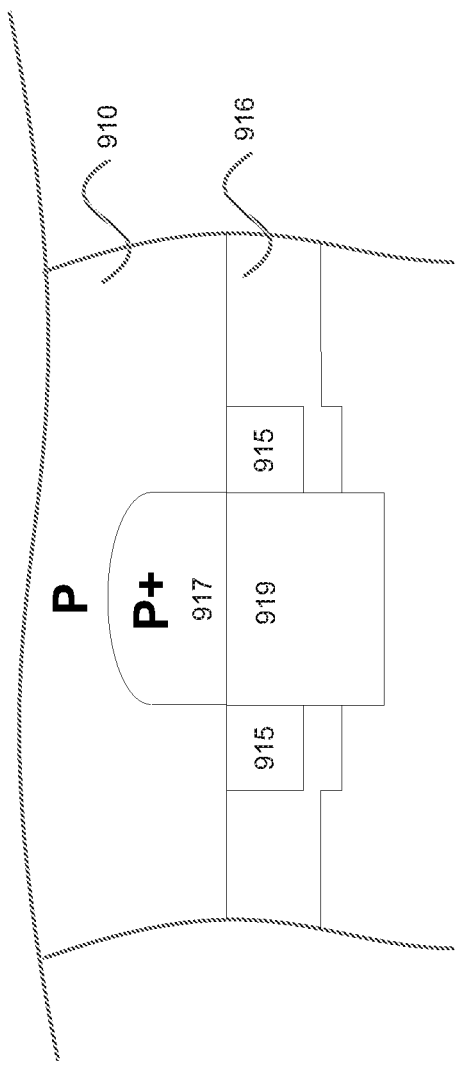

Referring to FIGS. 9A-B, a simplified set of diagrams of a front-contact solar cell with a rear floating junction in which a particle masking layer is deposited after the rear phosphorous diffusion is substantially removed, in accordance with the invention.

Silicon substrate 910 is first exposed to $POCl_3$ in order to form front heavily doped phosphorous (emitter) region 908. Front surface PSG and rear surface PSG (not shown) generated as part of the diffusion processes are removed (as previously described). In addition, unlike in FIGS. 3A-B above, the rear heavily doped phosphorous region (also formed during the $POCl_3$ diffusion) is etched away, for example using a single sided etch with KOH, NaOH or $HF:HNO_3$. Particle masking layer 915 is deposited on the rear substrate surface in order to prevent shunting of inversion layer formed from the subsequently deposited rear $SiN_x$ layer 916.

This particle masking layer may be baked and/or chemically processed as described above. Optionally the substrates may be exposed to a fast, high temperature process to further sinter the nanoparticle film. This process may also contain an oxidizing ambient to selectively oxidize the nanoparticle film.

In general, the electrical behavior of the $SiN_x$-silicon interface is similar to that of a p-n junction, with fixed charge in the $SiN_x$ film resulting in the formation of an inversion layer in the lightly doped silicon wafer bulk. If this induced floating junction is not isolated from a metal contact, it would shunt minority carriers and degrade current and thus efficiency in a similar way as has been described for the diffused p-n junction above. The set of metal contacts, comprising front-metal contacts 902 and back metal contacts 919, are then sequentially formed on and subsequently fired into substrate 910 as described above. Furthermore, in the case of the rear surface, rear metal contact 919 (generally aluminum with a boron dopant) a highly doped p-type region 917 is also formed in substrate 910. Consequently, a non-shunting contact with boron doped silicon substrate 910 is formed through particle masking layer 915.

Referring to FIGS. 10A-E, a simplified process for manufacturing a front-contact solar cell with a rear floating junction in which a particle masking layer is deposited after the rear phosphorous diffusion is substantially removed, in accordance with the invention.

Figure 10A:
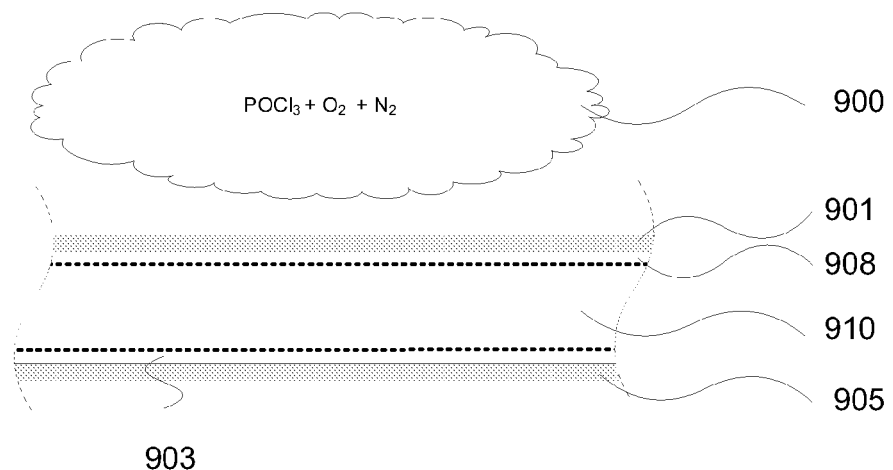
FIGS. 10A-E show a simplified process for manufacturing a front-contact solar cell with a rear floating junction in which a particle masking layer is deposited after the rear phosphorous diffusion is substantially removed, in accordance with the invention.

Initially in FIG. 10A, a boron doped silicon substrate 910 is exposed to a $POCl_3$ ambient 900 (as previously described). Consequently, a front heavily doped phosphorous region 908 and a rear heavily doped phosphorous region 903 are created in the substrate. In addition, front surface PSG 901 and rear surface PSG 905 are formed on both the front and rear as part of the $POCl_3$ diffusion process.

Figure 10B:
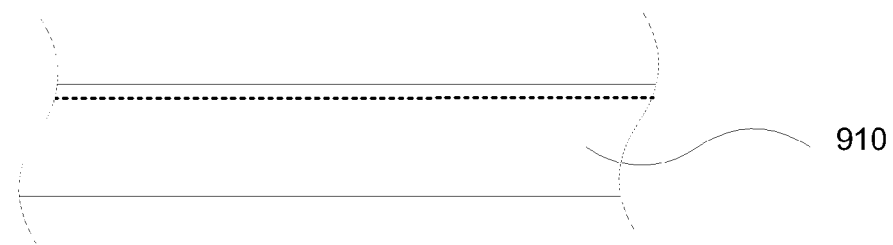

Next in FIG. 10B, front surface PSG 901, rear surface PSG 905 are removed using appropriate etchants, such as such as hydrofluoric acid (HF). In addition, rear heavily doped phosphorous region 903 is removed from the substrate, for example by performing a single sided etching process with KOH.

Figure 10C:
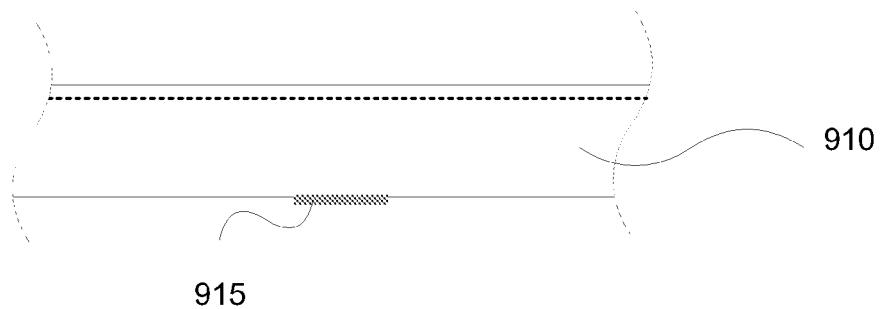

Next in FIG. 10C, masking particle dielectric/tunneling barrier 915 is deposited on the rear substrate surface.

Figure 10D:
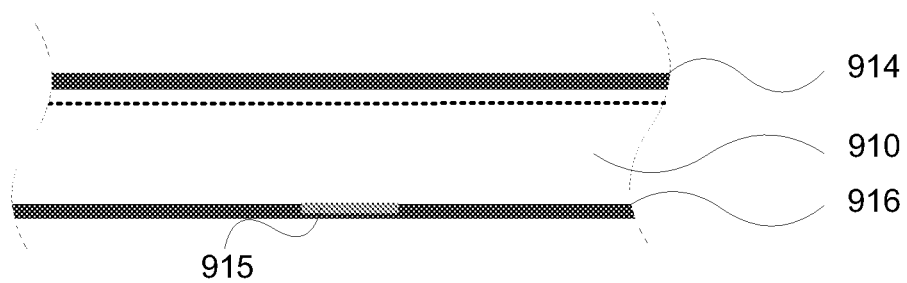

Next in FIG. 10D, front $SiN_x$ layer 914 and rear $SiN_x$ layer 916 are deposited in order to passivate both the front and rear substrate surfaces, as well as to allow more light photons to be captured and converted into charge carriers by doped silicon substrate 910.

Figure 10E:
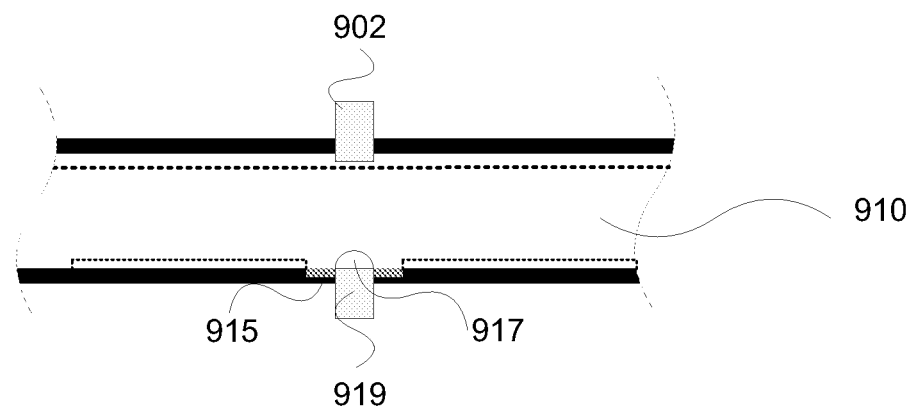

Finally in FIG. 10E, front metal contact 902 and rear metal contact 919 are formed as previously described. In the case of the rear surface, rear metal contact 919 (generally aluminum with a boron dopant) is fired through rear $SiN_x$ layer 916, forming a highly doped p-type region 917 in substrate 910. Consequently, a non-shunting contact with boron doped silicon substrate 910 is formed through particle masking layer 915.

The inventions illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed.

Thus, it should be understood that although the present invention has been specifically disclosed by preferred embodiments and optional features, modification, improvement and variation of the inventions herein disclosed may be resorted to by those skilled in the art, and that such modifications, improvements and variations are considered to be within the scope of this invention. The materials, methods, and examples provided here are representative of preferred embodiments, are exemplary, and are not intended as limitations on the scope of the invention.

As will be understood by one skilled in the art, for any and all purposes, particularly in terms of providing a written description, all ranges disclosed herein also encompass any and all possible sub-ranges and combinations of sub-ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. In addition, the terms "dopant or doped" and "counter-dopant or counter-doped" refer to a set of dopants of opposite types. That is, if the dopant is p-type, then the counter-dopant is n-type. Furthermore, unless otherwise dopant-types may be switched. In addition, the silicon substrate may be either mono-crystalline or multi-crystalline.

All publications, patent applications, issued patents, and other documents referred to in this specification are herein incorporated by reference as if each individual publication, patent application, issued patent, or other document were specifically and individually indicated to be incorporated by reference in its entirety. Definitions that are contained in text incorporated by reference are excluded to the extent that they contradict definitions in this disclosure.

For the purposes of this disclosure and unless otherwise specified, "a" or "an" means "one or more." All patents, applications, references and publications cited herein are incorporated by reference in their entirety to the same extent as if they were individually incorporated by reference. In addition, the word set refers to a collection of one or more items or objects.

Advantages of the invention include a method of forming a floating junction on a solar cell with particle masking layer. Having disclosed exemplary embodiments and the best mode, modifications and variations may be made to the disclosed embodiments while remaining within the subject and spirit of the invention as defined by the following claims.

What is claimed is:

1. A method of forming a floating junction on a substrate, comprising:
   providing the substrate doped with boron atoms, the substrate comprising a front surface and a rear surface;
   depositing a set of masking particles on the rear surface in a set of patterns;
   heating the substrate in a baking ambient to a first temperature and for a first time period in order to create a particle masking layer;
   exposing the substrate to a phosphorous deposition ambient at a second temperature and for a second time period, wherein a front surface PSG layer, a front surface phosphorous diffusion, a rear surface PSG layer, and a rear surface phosphorous diffusion are formed, and wherein a first phosphorous dopant surface concentration in the substrate proximate to the set of patterns is less than a second dopant surface concentration in the substrate not proximate to the set of patterns;
   exposing the substrate to a set of etchants for a third time period, wherein the front surface PSG layer and the rear surface PSG layer are substantially removed;
   depositing a front surface $SiN_x$ layer and a rear surface $SiN_x$ layer; and
   forming a rear metal contact on the rear surface through the rear surface $SiN_x$ layer proximate to the set of patterns.

2. The method of claim 1, wherein the first phosphorous dopant surface concentration is less than 1e19 $cm^{-3}$.

3. The method of claim 1, wherein the rear metal contact comprises one of silver and aluminum.

4. The method of claim 1, wherein the rear surface $SiN_x$ layer has a refractive index between about 2.2 and about 2.4.

5. The method of claim 1, wherein the front surface $SiN_x$ layer has a refractive index between about 2.0 and about 2.1.

6. The method of claim 1, wherein the second time period is between about 10 minutes and about 40 minutes, and the second temperature is between about 800° C. and about 900° C.

7. The method of claim 1, wherein the first time period is between about 30 seconds and about 20 minutes and the first temperature is between about 100° C. and about 600° C.

8. The method of claim 1, wherein the set of masking particles contains boron.

9. The method of claim 1, wherein the set of masking particles contains at least one of Si, $SiO_x$ (where x is a positive integer), $Si_xN_y$, (where x and y are positive integers), $TiO_2$, $Al_2O_3$, MgO, CaO, $Li_2O$, BeO, SrO, $Sc_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Tb_2O_3$, $Dy_2O_3$, $Ho_2O_3$, $Er_2O_3$, $Tm_2O_3$, $Yb_2O_3$, $Lu_2O_3$, $ThO_2$, $UO_2$, $ZrO_2$, and $HfO_2$.

10. The method of claim 1, further including exposing the substrate to an oxidizing ambient, after depositing a set of masking particles on the rear surface in a set of patterns.

11. The method of claim 10, wherein said exposing the substrate to the oxidizing ambient is performed prior to said exposing the substrate to the phosphorous deposition ambient.

* * * * *